United States Patent
Kim et al.

(10) Patent No.: US 9,905,676 B2
(45) Date of Patent: Feb. 27, 2018

(54) SEMICONDUCTOR DEVICES AND METHODS OF MANUFACTURING THE SAME

(71) Applicant: Samsung Electronics Co., Ltd., Suwon-si, Gyeonggi-do (KR)

(72) Inventors: JinBum Kim, Seoul (KR); Kang Hun Moon, Incheon (KR); Choeun Lee, Pocheon-si (KR); Sujin Jung, Hwaseong-si (KR); Yang Xu, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/134,556

(22) Filed: Apr. 21, 2016

(65) Prior Publication Data

US 2016/0359021 A1 Dec. 8, 2016

(30) Foreign Application Priority Data

Jun. 4, 2015 (KR) ........................ 10-2015-0079348

(51) Int. Cl.
| | |
|---|---|
| *H01L 29/66* | (2006.01) |
| *H01L 29/78* | (2006.01) |
| *H01L 29/08* | (2006.01) |
| *H01L 21/8234* | (2006.01) |
| *H01L 29/06* | (2006.01) |

(52) U.S. Cl.
CPC .................. *H01L 29/66795* (2013.01); *H01L 21/823425* (2013.01); *H01L 21/823431* (2013.01); *H01L 29/0657* (2013.01); *H01L 29/0688* (2013.01); *H01L 29/0847* (2013.01); *H01L 29/6656* (2013.01); *H01L 29/7848* (2013.01)

(58) Field of Classification Search
CPC ....... H01L 29/66759; H01L 21/823425; H01L 21/823431
See application file for complete search history.

(56) References Cited

U.S. PATENT DOCUMENTS

| | | |
|---|---|---|
| 7,274,051 B2 | 9/2007 | Kim et al. |
| 7,709,277 B2 | 5/2010 | Lee et al. |
| 8,169,024 B2 | 5/2012 | Cheng et al. |
| 8,361,859 B2 | 1/2013 | Adam et al. |
| 8,420,464 B2 | 4/2013 | Basker et al. |
| 8,440,517 B2 | 5/2013 | Lin et al. |
| 8,614,127 B1 | 12/2013 | Yang et al. |

(Continued)

*Primary Examiner* — Errol Fernandes
(74) *Attorney, Agent, or Firm* — Myers Bigel, P.A.

(57) ABSTRACT

Methods of forming an integrated circuit device are provided. The methods may include forming a gate structure on a substrate, forming a first etch mask on a sidewall of the gate structure, anisotropically etching the substrate using the gate structure and the first etch mask as an etch mask to form a preliminary recess in the substrate, forming a sacrificial layer in the preliminary recess, forming a second etch mask on the first etch mask, etching the sacrificial layer and the substrate beneath the sacrificial layer using the gate structure and the first and second etch masks as an etch mask to form a source/drain recess in the substrate, and forming a source/drain in the source/drain recess. A sidewall of the source/drain recess may be recessed toward the gate structure relative to an outer surface of the second etch mask.

20 Claims, 39 Drawing Sheets

(56) References Cited

U.S. PATENT DOCUMENTS

| | | |
|---|---|---|
| 8,685,825 B2 | 4/2014 | Tang et al. |
| 8,697,522 B2 | 4/2014 | Cheng et al. |
| 8,716,797 B2 | 5/2014 | Basker et al. |
| 8,895,396 B1 * | 11/2014 | Fu .................. H01L 21/823418 438/197 |
| 2009/0068810 A1 * | 3/2009 | Tsai .................... H01L 29/6656 438/300 |
| 2013/0248948 A1 | 9/2013 | Ma et al. |
| 2013/0285019 A1 | 10/2013 | Kim et al. |
| 2014/0167163 A1 | 6/2014 | Cheng et al. |
| 2014/0191300 A1 | 7/2014 | Jhaveri et al. |
| 2014/0193959 A1 | 7/2014 | Lo |
| 2014/0199817 A1 | 7/2014 | Tsai et al. |
| 2014/0239394 A1 | 8/2014 | Cheng et al. |

\* cited by examiner

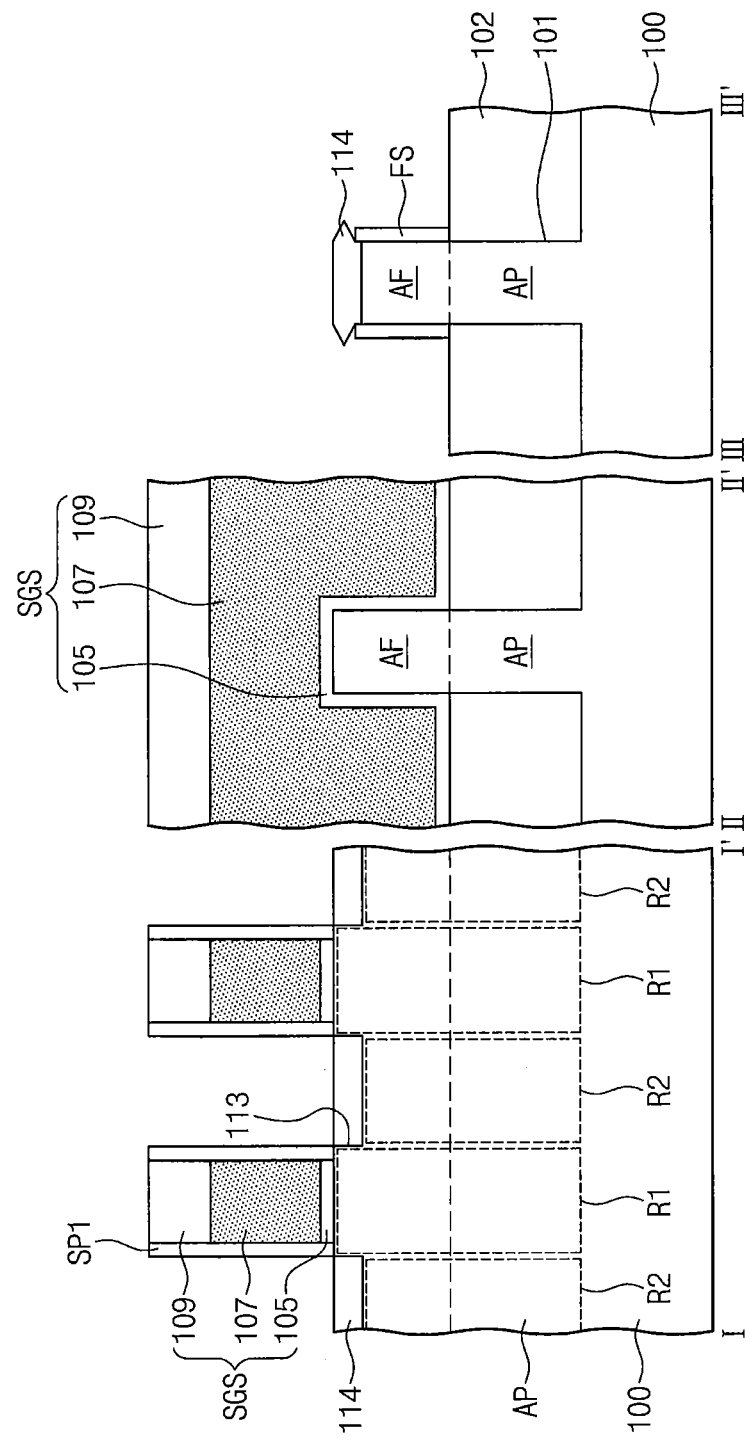

SEMICONDUCTOR DEVICES AND METHODS OF MANUFACTURING THE SAME

CROSS-REFERENCE TO RELATED APPLICATION

This U.S. non-provisional patent application claims priority under 35 U.S.C. § 119 to Korean Patent Application No. 10-2015-0079348, filed on Jun. 4, 2015, in the Korean Intellectual Property Office, the disclosure of which is hereby incorporated by reference in its entirety.

BACKGROUND

The inventive concepts relate to a semiconductor device and a method of manufacturing the same. More particularly, the inventive concepts relate to a semiconductor device including a fin field effect transistor and a method of manufacturing the same.

A semiconductor device may include an integrated circuit including metal-oxide-semiconductor field effect transistors (MOSFETs). As sizes and design rules of semiconductor devices have been reduced, sizes of MOSFETs have also been scaled down. Performances of semiconductor devices may be deteriorated by the scale down of the MOSFETs. Thus, various researches are being conducted to improve performances of high density semiconductor devices.

SUMMARY

A method of forming an integrated circuit device may include forming a gate structure on a substrate, forming a first etch mask on a sidewall of the gate structure, anisotropically etching the substrate using the gate structure and the first etch mask as an etch mask to form a preliminary recess in the substrate, forming a sacrificial layer in the preliminary recess, forming a second etch mask on the first etch mask, etching the sacrificial layer and the substrate beneath the sacrificial layer using the gate structure and the first and second etch masks as an etch mask to form a source/drain recess in the substrate, and forming a source/drain in the source/drain recess. The first etch mask may be between the sidewall of the gate structure and the second etch mask. A sidewall of the source/drain recess may be recessed toward the gate structure relative to an outer surface of the second etch mask.

In various embodiments, etching the sacrificial layer and the substrate may include exposing a sidewall of the preliminary recess.

According to various embodiments, forming the first etch mask may include forming the first etch mask having a thickness of about 1 nm to about 10 nm on the sidewall of the gate structure such that a sidewall of the preliminary recess is spaced apart from the sidewall of the gate structure by about 1 nm to about 10 nm.

In various embodiments, an upper portion of a sidewall of the preliminary recess may be substantially perpendicular to a lowermost surface of the gate structure.

In various embodiments, the preliminary recess may be a first preliminary recess, and etching the sacrificial layer and the substrate may include etching the sacrificial layer and the substrate using the gate structure and the first and second etch masks as an etch mask to form a second preliminary recess in the sacrificial layer and the substrate and removing the sacrificial layer to form the source/drain recess in the substrate.

According to various embodiments, the second preliminary recess may extend through the sacrificial layer.

According to various embodiments, etching the sacrificial layer and the substrate may include performing an anisotropic etch process and an isotropic etch process.

In various embodiments, etching the sacrificial layer and the substrate may etch the sacrificial layer faster than the substrate.

A method of forming an integrated circuit device may include forming a gate structure on a substrate, forming a sacrificial layer adjacent a sidewall of the gate structure in the substrate, forming an etch mask on the sidewall of the gate structure and a portion of the sacrificial layer, etching the sacrificial layer and the substrate beneath the sacrificial layer using the gate structure and the etch mask as an etch mask to form a source/drain recess in the substrate and forming a source/drain in the source/drain recess. An upper portion of a sidewall of the sacrificial layer may be substantially perpendicular to a lowermost surface of the gate structure.

According to various embodiments, an uppermost sidewall of the source/drain may be recessed toward the gate structure relative to an outer surface of the etch mask.

According to various embodiments, the uppermost sidewall of the source/drain may be substantially perpendicular to the lowermost surface of the gate structure.

In various embodiments, etching the sacrificial layer and the substrate may include etching the sacrificial layer and the substrate using the gate structure and the etch mask as an etch mask to form a preliminary recess that extends through the sacrificial layer and removing the sacrificial layer to form the source/drain recess in the substrate.

According to various embodiments, removing the sacrificial layer may include exposing a sidewall of the preliminary recess such that the sidewall of the preliminary recess may be a portion of a sidewall of the source/drain recess.

According to various embodiments, forming the sacrificial layer may include etching the substrate to form a recess adjacent the sidewall of the gate structure in the substrate and performing an epitaxial growth process using a surface of the recess as a seed layer to form the sacrificial layer in the recess. The sidewall of the recess may be substantially perpendicular to the lowermost surface of the gate structure.

A method of forming an integrated circuit device may include forming a gate structure on a substrate and forming a first recess adjacent a sidewall of the gate structure in the substrate. A sidewall of the first recess may be substantially perpendicular to a lowermost surface of the gate structure and may be spaced apart from the sidewall of the gate structure by a first distance. The method may also include forming a sacrificial layer in the first recess, forming a second recess that extends through the sacrificial layer and in a portion of the substrate beneath the sacrificial layer, removing the sacrificial layer to form a source/drain recess in the substrate and forming a source/drain in the source/drain recess. An uppermost sidewall of the second recess being spaced apart from the sidewall of the gate structure by a second distance that is greater than the first distance.

In various embodiments, the second recess may have a depth greater than a depth of the first recess.

According to various embodiments, removing the sacrificial layer may include exposing the sidewall of the first recess such that the sidewall of the first recess may be a portion of a sidewall of the source/drain recess.

In various embodiments, the first distance may be about 1 nm to about 10 nm.

According to various embodiments, the uppermost sidewall of the second recess may expose the sacrificial layer.

According to various embodiments, an uppermost sidewall of the source/drain may be spaced apart from the sidewall of the gate structure by a third distance that is smaller than the second distance.

BRIEF DESCRIPTION OF THE DRAWINGS

The inventive concepts will become more apparent in view of the attached drawings and accompanying detailed description.

FIGS. 4B, 5B, 6B, 7B, 8B, 9B, 10B and 11B are cross-sectional views taken along the lines I-I', II-II' and III-III' of FIGS. 4A to 11A, respectively.

DETAILED DESCRIPTION OF THE EMBODIMENTS

Figure 1A:
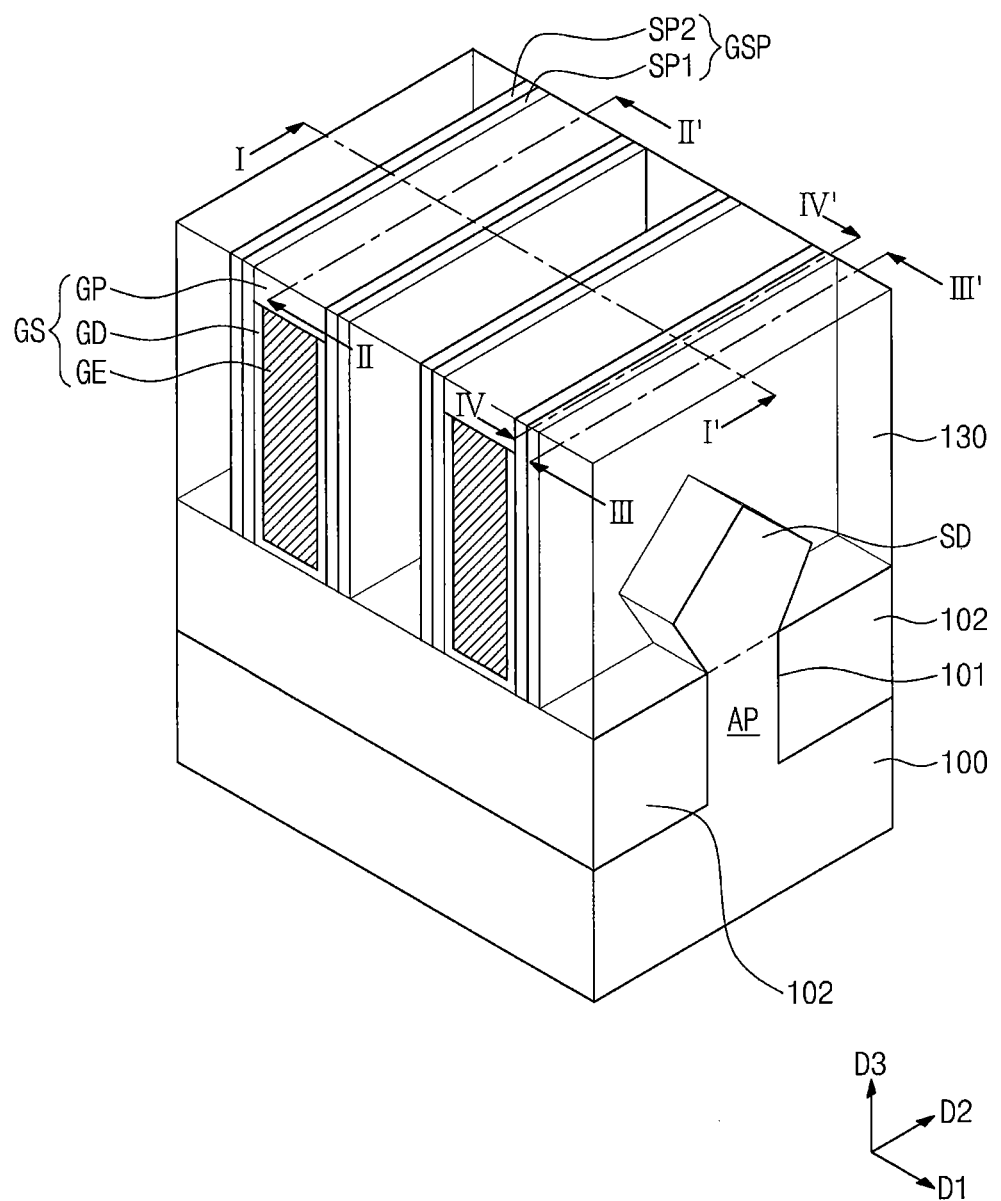
FIG. 1A is a perspective view illustrating a semiconductor device according to some embodiments of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. The example embodiments are provided so that this disclosure will be thorough and complete and will convey the scope of the disclosure to those skilled in the art. In the drawings, the sizes and relative sizes of layers and regions may be exaggerated for clarity. As used herein, the term "and/or" includes any and all combinations of one or more of the associated listed items.

In the specification, it will be understood that when an element such as a layer, region or substrate is referred to as being "on" another element, it can be directly on the other element or intervening elements may be present. It will be understood that "an element A covers element B" means that the element A is on the element B and does not necessarily means that the element A is on the entire portion of the element B. The same reference numerals or the same reference designators denote the same elements throughout the specification.

The embodiments in the detailed description will be described with cross-sectional and perspective views as ideal views of the inventive concepts. Accordingly, shapes of the example embodiments may be modified according to manufacturing techniques and/or allowable errors. Therefore, the embodiments of the inventive concepts are not limited to the specific shape illustrated in the drawings, but may include other shapes that may be formed according to manufacturing processes. It will be also understood that although the terms first, second, third etc. may be used herein to describe various elements, these elements should not be limited by these terms. These terms are only used to distinguish one element from another element. Example embodiments of aspects of the present inventive concepts explained and illustrated herein include their complementary counterparts.

The terminology used herein is for the purpose of describing particular embodiments only and is not intended to limit the inventive concepts. As used herein, the singular terms "a," "an" and "the" are intended to include the plural forms as well, unless the context clearly indicates otherwise. It will be further understood that the terms "comprises", "comprising,", "includes" and/or "including", when used herein, specify the presence of stated features, steps, operations, elements, and/or components, but do not preclude the presence or addition of one or more other features, operations, elements, components, and/or groups thereof.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, example embodiments of the inventive concepts will be fully described with reference to the accompanying drawings.

Figure 1B:
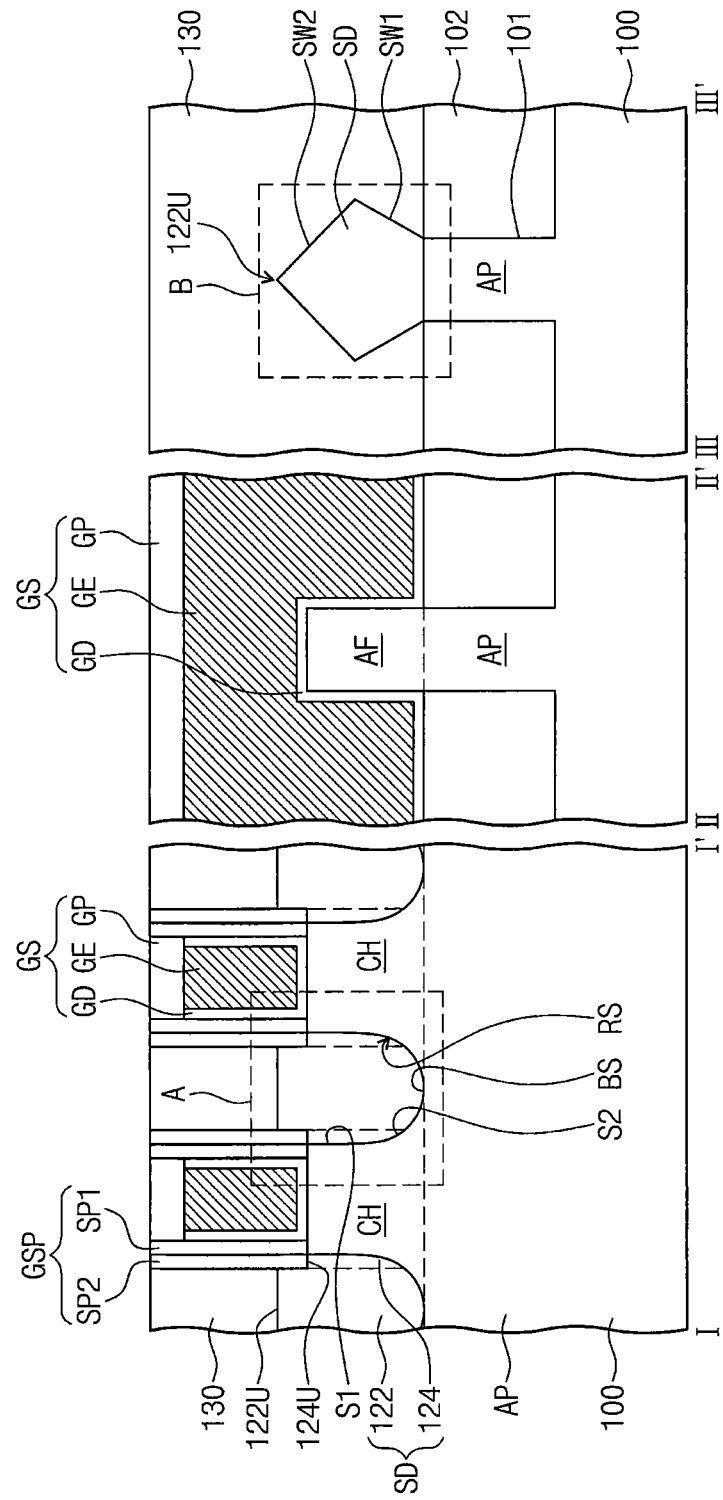
FIG. 1B is a cross-sectional view taken along the lines I-I', II-II', and III-III' of FIG. 1A.
Figure 1C:
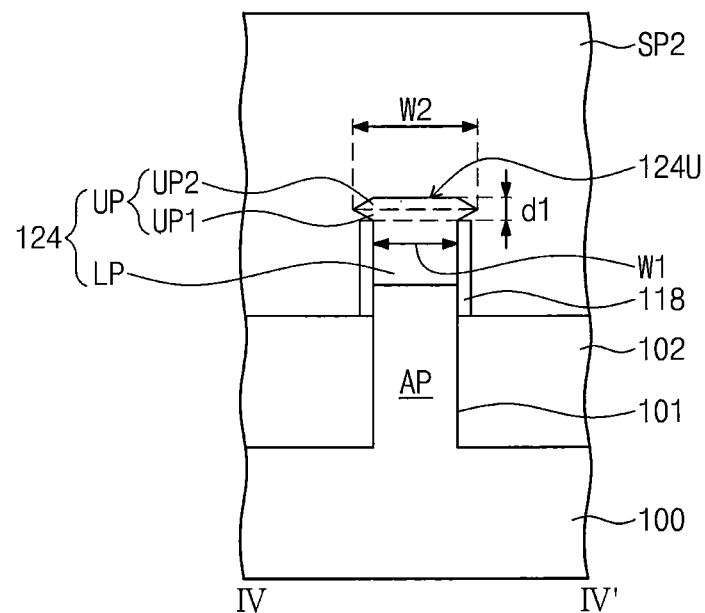
FIGS. 1C and 1D are cross-sectional views taken along the line IV-IV' of FIG. 1A.
Figure 1D:
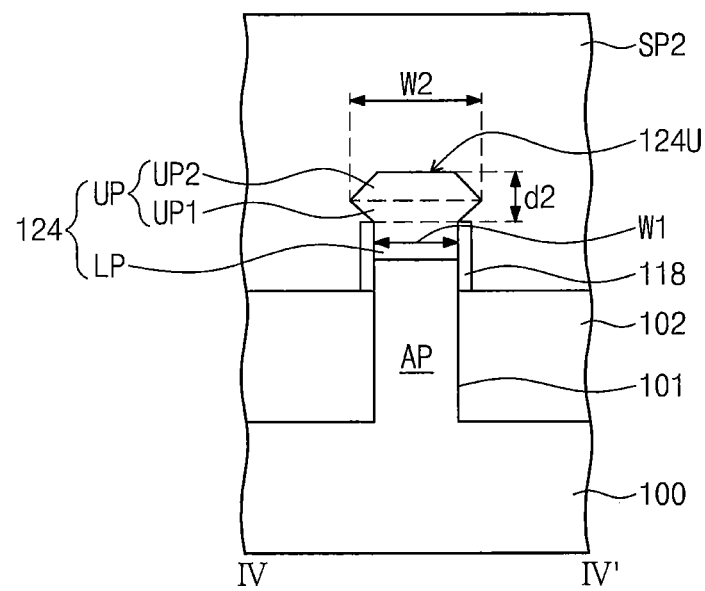
Figure 2A:
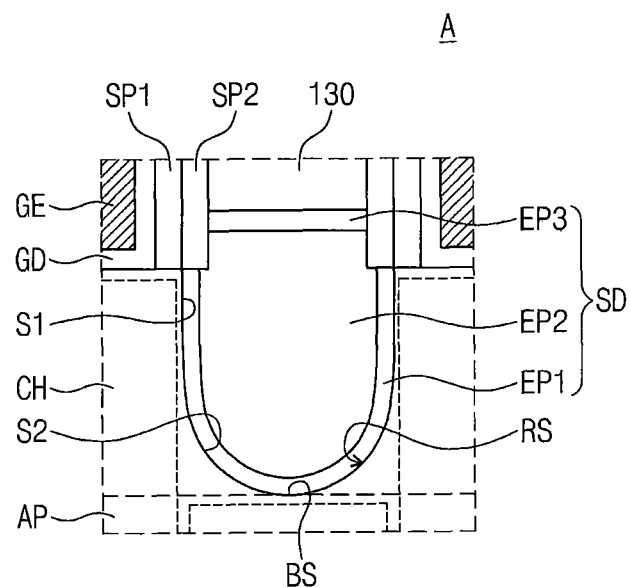
FIGS. 2A and 2B are enlarged views of the portions 'A' and 'B' of FIG. 1B, respectively.
Figure 2B:
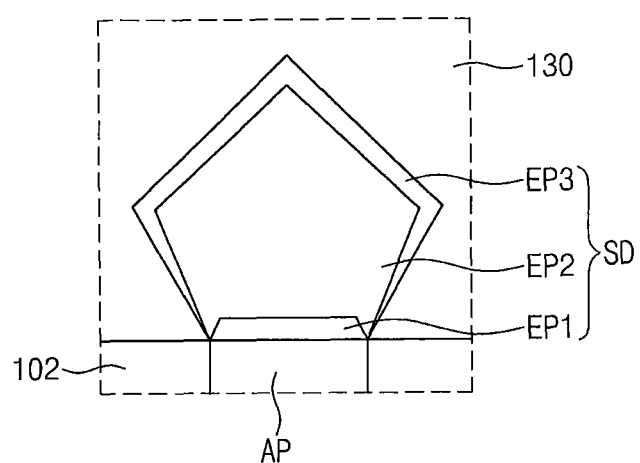
Figure 3:
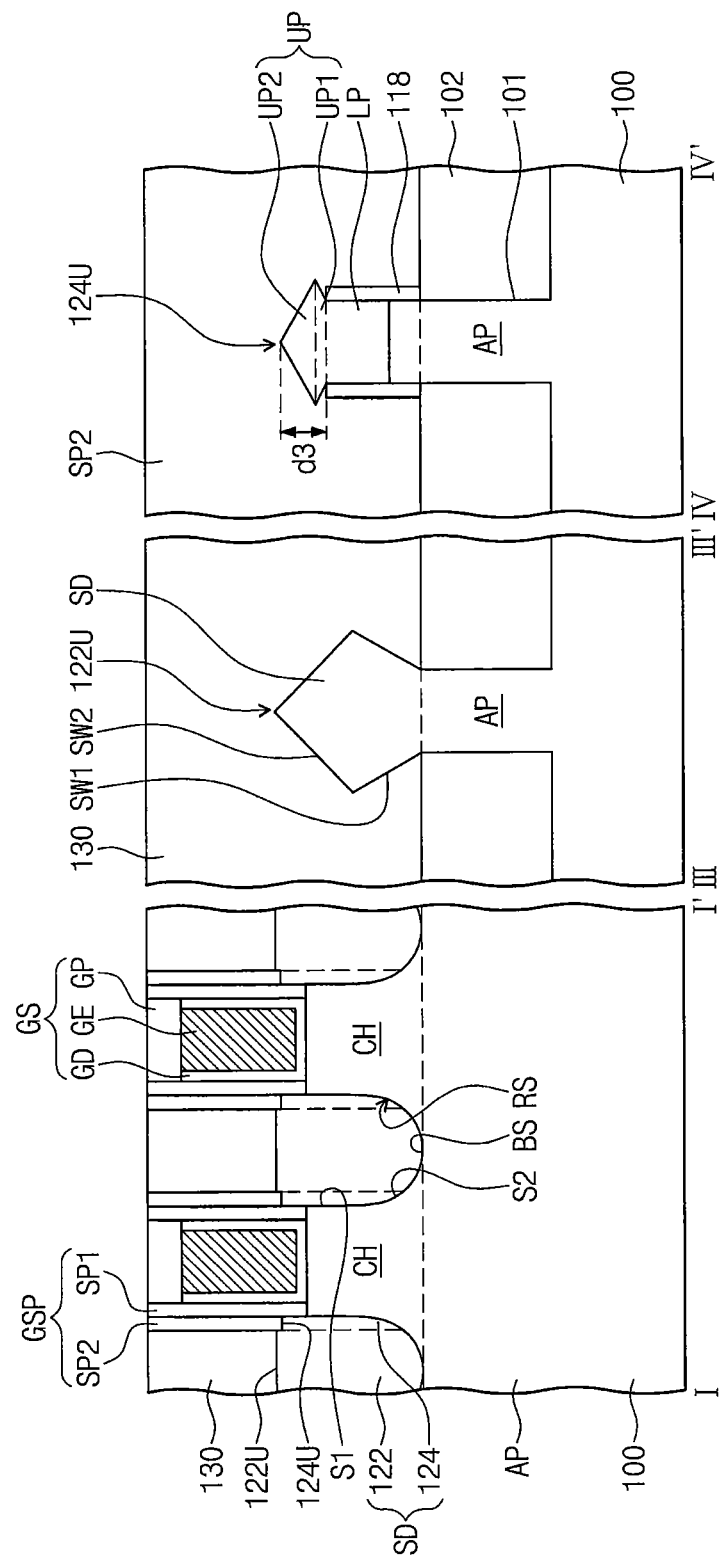
FIG. 3 are cross-sectional views taken along the lines I-I', III-III', and IV-IV of FIG. 1A to illustrate a semiconductor device according to some embodiments of the inventive concepts.

FIG. 1A is a perspective view illustrating a semiconductor device according to some embodiments of the inventive concepts. FIG. 1B is a cross-sectional view taken along the lines I-I', II-II', and III-III' of FIG. 1A. FIGS. 1C and 1D are cross-sectional views taken along the line IV-IV' of FIG. 1A. FIGS. 2A and 2B are enlarged views of the portions 'A' and 'B' of FIG. 1B, respectively. FIG. 3 is a cross-sectional view taken along the lines I-I', III-III', and IV-IV of FIG. 1A to illustrate a semiconductor device according to some embodiments of the inventive concepts.

Referring to FIGS. 1A, 1B, and 1C, an active pattern AP may be provided on a substrate 100. The substrate 100 may be a semiconductor substrate. For example, the substrate 100 may be a silicon substrate, a germanium substrate, or a silicon-on-insulator (SOI) substrate. The active pattern AP may extend in a first direction D1. In detail, a longitudinal direction of the active pattern AP may extend in the first direction D1, and a transverse direction of the active pattern AP may extend in a second direction D2 intersecting the first direction D1. In addition, the active pattern AP may protrude from the substrate 100 in a third direction D3 perpendicular to both the first direction D1 and the second direction D2. In some embodiments, the active pattern AP may be a portion of the substrate 100. In some embodiments, the active pattern AP may include an epitaxial layer grown from the substrate 100. In some embodiments, the epitaxial layer may include a plurality of epitaxial layers having different lattice constants. Thus, a compressive strain or a tensile strain may be applied to the active pattern AP. One active pattern AP is illustrated in FIGS. 1A to 1C. However, the inventive concepts are not limited thereto. In some embodiments, a plurality of active patterns AP may be provided on the substrate 100. The plurality of active patterns AP may be arranged along the second direction D2.

Device isolation patterns 102 may be disposed at both sides of the active pattern AP. For example, the device isolation patterns 102 may include silicon oxide, silicon nitride, and/or silicon oxynitride. The device isolation patterns 102 may cover portions of sidewalls of the active pattern AP. In other words, an upper portion of the active pattern AP may be exposed by the device isolation patterns 102. The upper portion of the active pattern AP, which is exposed by the device isolation patterns 102, may be defined as an active fin AF. The active fin AF may be locally disposed under a gate structure GS.

The gate structure GS may be disposed on the substrate 100. The gate structure GS may extend in the second direction D2 to intersect the active pattern AP. The gate structure GS may cover portions of the sidewalls of the active pattern AP. In other words, the gate structure GS may intersect the active pattern AP and may cover a top surface and sidewalls of the active fin AF. Hereinafter, the active fin AF locally disposed under the gate structure GS may be referred to as 'a channel region CH'. The gate structure GS may be provided in plurality. The plurality of gate structures GS may be arranged along the first direction D1.

Gate spacers GSP may be disposed on sidewalls of the gate structures GS. The gate spacers GSP may extend along the sidewalls of the gate structures GS in the second direction D2. According to some embodiments, the gate spacer GSP may include a first gate spacer SP1 adjacent to the gate structure GS and a second gate spacer SP1 disposed on a sidewall of the first gate spacer SP1. In other words, the second gate spacer SP2 may be disposed on the sidewall of the gate structure GS with the first gate spacer SP1 interposed therebetween. A thickness of the second gate spacer SP2 may be substantially equal to or greater than a thickness of the first gate spacer SP1. For example, the first gate spacer SP1 may have a thickness ranging from about 1 nm to about 10 nm, and the second gate spacer SP2 may have a thickness ranging from about 1 nm to about 50 nm. In some embodiments, the first and second gate spacers SP1 and SP2 may include the same material. For example, the first and second gate spacers SP1 and SP2 may include a silicon nitride layer, a silicon oxynitride layer, or a silicon oxy-carbonitride layer. In some embodiments, the first and second gate spacers SP1 and SP2 may include different materials. For example, the first gate spacer SP1 may include a silicon oxy-carbonitride layer, and the second gate spacer SP2 may include a silicon nitride layer, or vice versa.

Each of the gate structures GS may include a gate electrode GE, a gate capping pattern GP on the gate electrode GE, and a gate dielectric pattern GD between the gate electrode GE and the gate spacers GSP. The gate dielectric pattern GD may also be disposed between the gate electrode GE and the active fin AF and may horizontally extend from the active fin AF to partially cover top surfaces of the device isolation patterns 102. The gate dielectric pattern GD may extend along a bottom surface of the gate electrode GE.

The gate electrode GE may include a conductive metal nitride (e.g., titanium nitride or tantalum nitride) and/or a metal (e.g., aluminum or tungsten). The gate dielectric pattern GD may include at least one of high-k dielectric layers. For example, the gate dielectric pattern GD may include hafnium oxide, hafnium silicate, zirconium oxide, and/or zirconium silicate. The gate capping pattern GP may include, for example, silicon nitride or silicon oxynitride.

Recess regions RS may be provided on the active pattern AP at both sides of each of the gate structures GS. In some embodiments, one of the recess regions RS (e.g., the recess region RS on the active pattern AP between the gate structures GS adjacent to each other) may be defined as a space between the channel regions CH locally disposed under the gate structures GS. In other words, the one of the recess regions RS may have sidewalls defined by sidewalls, facing each other, of the channel regions CH adjacent to each other. Hereinafter, the recess region RS on the active pattern AP between the adjacent gate structures GS will be mainly described for the purpose of ease and convenience in explanation.

According to the inventive concepts, the recess region RS may have a U-shaped cross-section having uppermost sidewalls that are substantially perpendicular to a top surface of the substrate 100 (i.e., a lowermost surface of the gate structure GS). In detail, the recess region RS may include an upper portion having a uniform width and a lower portion having a width becoming narrower toward a bottom surface of the recess region RS, when viewed from a cross-section taken along the first direction D1. The upper portion of the recess region RS may be defined by first sidewalls S1 substantially perpendicular to the top surface of the substrate 100, and the lower portion of the recess region RS may be defined by second sidewalls S2 and a bottom surface BS connected to the second sidewalls S2. The second sidewalls S2 may be rounded. The second sidewalls S2 may be convex toward lower portions of the channel regions CH adjacent to each other. Due to the shape of the recess region RS, each of the channel regions CH may include an upper sidewall substantially perpendicular to the top surface of the substrate 100, and a lower sidewall having a concave surface. One end of the upper sidewall of the channel region CH may be connected to a top surface of the channel region CH. In some embodiments, the upper sidewall (i.e., the first sidewall S1) of the channel region CH may be aligned with the sidewall of the first gate spacer SP1 (i.e., outer surface of the first gate spacer SP1). In other words, the upper sidewall of the channel region CH and the sidewall of the first gate spacer SP1 adjacent thereto may be coplanar. However, embodiments of the inventive concepts are not limited thereto.

Source/drain regions SD may be provided on inner surfaces of the recess regions RS, respectively. In other words, the source/drain regions SD may be disposed on the active pattern AP at both sides of the gate structure GS. In some embodiments, the source/drain regions SD may include epitaxial layers that are formed using the active pattern AP, exposed by the recess regions RS, as a seed. For example, each of the source/drain regions SD may include at least one of silicon-germanium (SiGe), silicon (Si) and silicon carbide (SiC) which are epitaxial-grown from the active pattern AP exposed by the recess region RS. Thus, the source/drain regions SD may apply a compressive strain or a tensile strain to the channel regions CH. The source/drain regions SD may be doped with P-type or N-type dopants.

According to some embodiments, at least one of the source/drain regions SD may include a plurality of epitaxial layers. For example, as illustrated in FIGS. 2A and 2B, at least one of the source/drain regions SD may include a first epitaxial layer EP1 being in contact with the inner surface of the recess region RS, a second epitaxial layer EP2 on the first epitaxial layer EP1, and a third epitaxial layer EP3 on the second epitaxial layer EP2. The first epitaxial layer EP1 may correspond to a buffer layer that is in contact with the active pattern AP. The first epitaxial layer EP1 may be an epitaxial layer including a low-concentration semiconductor material. The second epitaxial layer EP2 may correspond to a main layer extending from the first epitaxial layer EP 1 and may be an epitaxial layer including a high-concentration semiconductor material. The third epitaxial layer EP3 may correspond to a capping layer that is disposed on the second epitaxial layer EP2 to protect the second epitaxial layer EP2. The third epitaxial layer EP3 may be an epitaxial layer including a semiconductor material. For example, if the source/drain region SD includes silicon-germanium (SiGe), the first epitaxial layer EP1 may be a SiGe layer having a low concentration of germanium, the second epitaxial layer EP2 may be a SiGe layer having a high concentration of germanium, and the third epitaxial layer EP3 may be a silicon layer.

Each of the source/drain regions SD may be in contact with the sidewalls S1 and S2 and the bottom surface BS of a corresponding recess region RS. The shape of the source/drain region SD may correspond to the shape of the recess region RS when viewed from a cross-section taken along the first direction D1. In more detail, the source/drain region SD may have upper sidewalls substantially perpendicular to the top surface of the substrate 100 and lower sidewalls having convex surfaces when viewed from a cross-section taken along the first direction D1. The upper sidewalls of the source/drain region SD may be defined by the first sidewalls S1 of the recess region RS, and the lower sidewalls of the source/drain region SD may be defined by the second sidewalls S2 of the recess region RS. As a result, an interface between the active pattern AP and the source/drain region SD may have a U-shaped cross-section having uppermost sidewalls that are substantially perpendicular to the top surface of the substrate 100, when viewed from a cross-section taken along the first direction D1. Each of the channel regions CH may have the top surface higher than bottom surfaces of the source/drain regions SD. Each of the channel regions CH may be disposed between the source/drain regions SD when viewed from a plan view. In some embodiments, the source/drain regions SD may protrude upward from the top surfaces of the channel regions CH.

Still referring to FIG. 1B, each of the source/drain regions SD may include a first portion 122 exposed by the gate spacer GSP, and a second portion 124 extending from the first portion 122 so as to be covered by the gate spacer GSP. In other words, the first portion 122 may not vertically overlap with the gate spacer GSP, but the second portion 124 may vertically overlap with the gate spacer GSP.

The first portion 122 may have first sidewalls SW1 and second sidewalls SW2 slanted with respect to the top surface of the substrate 100 when viewed from a cross-section taken along the second direction D2. The first sidewalls SW1 may diverge upwardly, and the second sidewalls SW2 may converge upwardly. One end of the first sidewall SW1 may be connected to one end of the second sidewall SW2. In some embodiments, the topmost end 122U of the first portion 122 may be higher than the top surfaces of the active fins AF (i.e., the channel regions CH).

As illustrated in FIG. 1C, the second portion 124 may include a lower portion LP having a first width W1 and an upper portion UP extend upward from the lower portion LP when viewed from a cross-section taken along the second direction D2. In some embodiments, the first width W1 may be substantially uniform throughout the lower portion LP. In some embodiments, the first width W1 may be gradually reduced as a distance from the substrate 100 increases. According to the inventive concepts, residual spacers 118 may be disposed between the second spacer SP2 and both sidewalls of the lower portion LP when viewed from a cross-section taken along the second direction D2. The residual spacers 118 may be disposed on the device isolation patterns 102 disposed at both sides of the active pattern AP and may be in contact with the sidewalls of the lower portion LP. Thus, the both sidewalls of the lower portion LP in the second direction D2 may not be in contact with the gate spacer SP2. The first width W1 of the lower portion LP, which is described above, may be defined as a distance between the residual spacers 118 facing each other in the second direction D2. The residual spacers 118 may include the same material as the first gate spacer SP1. For example, the residual spacers 118 may include a silicon nitride layer, a silicon oxynitride layer, or a silicon oxy-carbonitride layer. The upper portion UP of the second portion 124 may be exposed by the residual spacers 118. In other words, the upper portion UP may be disposed at a higher level than top surfaces (or topmost ends) of the residual spacers 118. The upper portion UP may be in contact with the second gate spacer SP2. In some embodiments, the upper portion UP may include a first upper portion UP1 having a width increasing as a distance from the substrate 100 increases, and a second upper portion UP2 having a width decreasing as a distance from the substrate 100 increases. In other words, sidewalls of the first upper portion UP1 may diverge upwardly, and sidewalls of the second upper portion UP2 may converge upwardly. The upper portion UP may have a second width W2 at a boundary between the first upper portion UP1 and the second upper portion UP2. The second width W2 may correspond to the maximum width of the upper portion UP. The second width W2 may be greater than the first width W1.

In some embodiments, a top surface 124U of the second portion 124 (i.e., a top surface of the second upper portion UP2) may be substantially parallel to the top surface of the substrate 100. In addition, the top surface 124U of the second portion 124 may be disposed at the substantially same height as the top surfaces of the channel regions CH. In this case, the upper portion UP of the second portion 124 may have a first thickness d1. The thickness of the upper portion UP may be changed. For example, if a thickness of the lower portion LP of the second portion 124 is reduced (i.e., heights of the top surfaces of the residual spacers 118 are lowered) while the height of the top surface 124U of the second portion 124 is fixed (i.e., the top surface 124U of the second portion 124 is disposed at the same height as the top surfaces of the channel regions CH), the upper portion UP may have a second thickness d2 greater than the first thickness d1, as illustrated in FIG. 1D. Volumes of the source/drain regions SD may be increased when the thickness of the upper portion UP is increased, so electrical characteristics of the semiconductor device may be improved.

In some embodiments, the top surface 124U of the second portion 124 may be higher than the top surfaces of the channel regions CH. As illustrated in FIG. 3, the top surface 124U (or the topmost end) of the second portion 124 may be higher than the top surfaces of the channel regions CH and may be lower than the topmost end 122U (or the top surface) of the first portion 122. The upper portion UP of the second portion 124 may have a third thickness d3 greater than the first thickness d1. In this case, the thickness of the upper portion UP of the second portion 124 may also be increased. In addition, the second upper portion UP2 of the second portion 124 may have a wedge shape that is upwardly tapered.

A lower interlayer insulating layer 130 may be disposed on the substrate 100 to cover the source/drain regions SD and the sidewalls of the gate structures GS. A top surface of the lower interlayer insulating layer 130 may be substantially coplanar with the top surfaces of the gate structures GS. For example, the lower interlayer insulating layer 130 may include at least one of a silicon oxide layer or low-k dielectric layers. The lower interlayer insulating layer 130 may cover the device isolation patterns 102 exposed by the gate structures GS.

According to some embodiments, an upper interlayer insulating layer (not shown) may be disposed on the lower interlayer insulating layer 130. The upper interlayer insulating layer may cover the top surfaces of the gate structures GS. For example, the upper interlayer insulating layer may include at least one of a silicon oxide layer, a silicon nitride layer, a silicon oxynitride layer, or low-k dielectric layers. First contact plugs (not shown) may penetrate the upper interlayer insulating layer and the lower interlayer insulating layer 130 so as to be electrically connected to the source/drain regions SD. A second contact plug (not shown) may penetrate the upper interlayer insulating layer and the lower interlayer insulating layer 130 so as to be electrically connected to the gate electrode GE. Interconnections (not shown) may be disposed on the upper interlayer insulating layer so as to be connected to the first and second contact plugs. Operating voltages may be applied to the source/drain regions SD and the gate electrode GE through the interconnections and the first and second contact plugs. The first and second contact plugs and the interconnections may include a conductive material.

A three-dimensional (3D) field effect transistor according to some embodiments of the inventive concepts may use a plurality of surfaces of the active fin AF as a channel, unlike a two-dimensional (2D) field effect transistor. In other words, the sidewall as well as the top surface of the active fin AF may be used as the channel. Thus, a uniform sidewall profile of the active AF according to a height may directly affect characteristics of the semiconductor device. According to some embodiments of the inventive concepts, the interface between the active fin AF (i.e., the channel regions CH) and the source/drain region SD may have the U-shaped cross-section having uppermost sidewalls that are substantially perpendicular to the top surface of the substrate 100, when viewed from the cross-section taken along the first direction D1. In other words, a uniform junction profile may be realized between the active fin AF and the source/drain region SD, so the electrical characteristics of the semiconductor device may be improved.

A method of manufacturing a semiconductor device according to some embodiments will be described hereinafter. FIGS. 4A, 5A, 6A, 7A, 8A, 9A, 10A and 11A are perspective views illustrating a method of manufacturing a semiconductor device according to some embodiments of the inventive concepts. FIGS. 4B to 11B are cross-sectional views taken along the lines I-I', II-II', and III-III' of FIGS. 4A to 11A, respectively. FIG. 7C is a cross-sectional view taken along the lines I-I', II-II' and III-III' of FIG. 7A. FIG. 9C is an enlarged view of the portion 'A' of FIG. 9B, and FIG. 9D is cross-sectional views taken along the lines I-I', II-II', and III-III' of FIG. 9A.

Figure 4A:
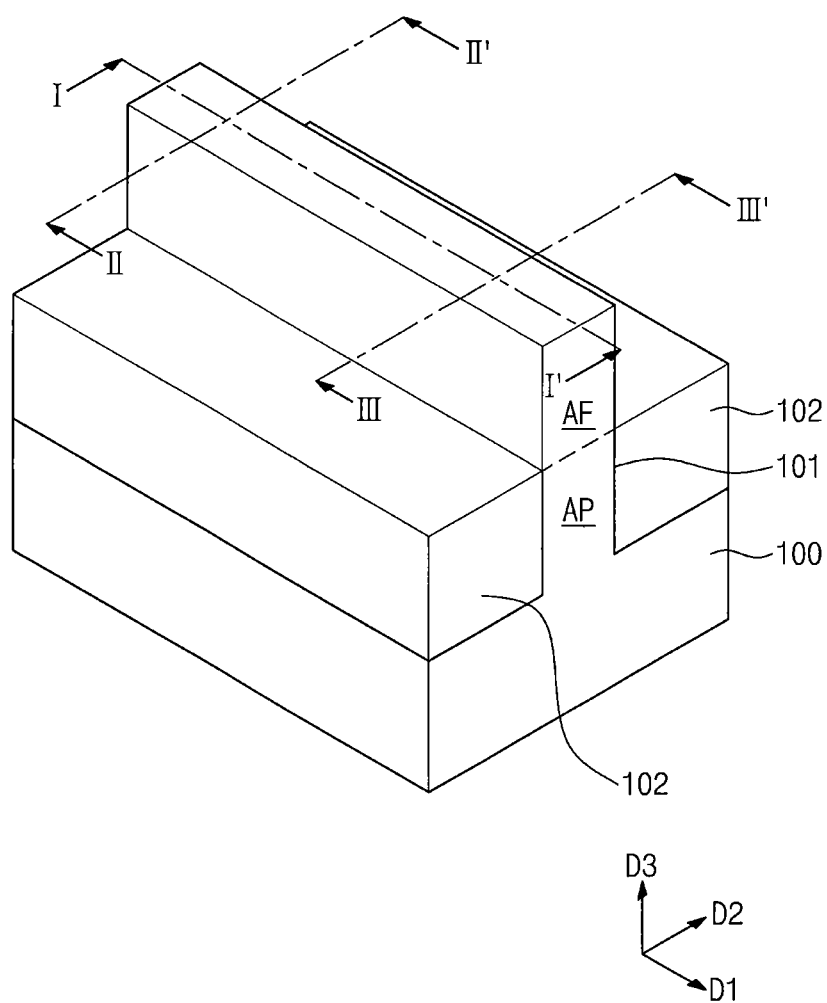
FIGS. 4A, 5A, 6A, 7A, 8A, 9A, 10A and 11A are perspective views illustrating a method of manufacturing a semiconductor device according to some embodiments of the inventive concepts.
Figure 4B:
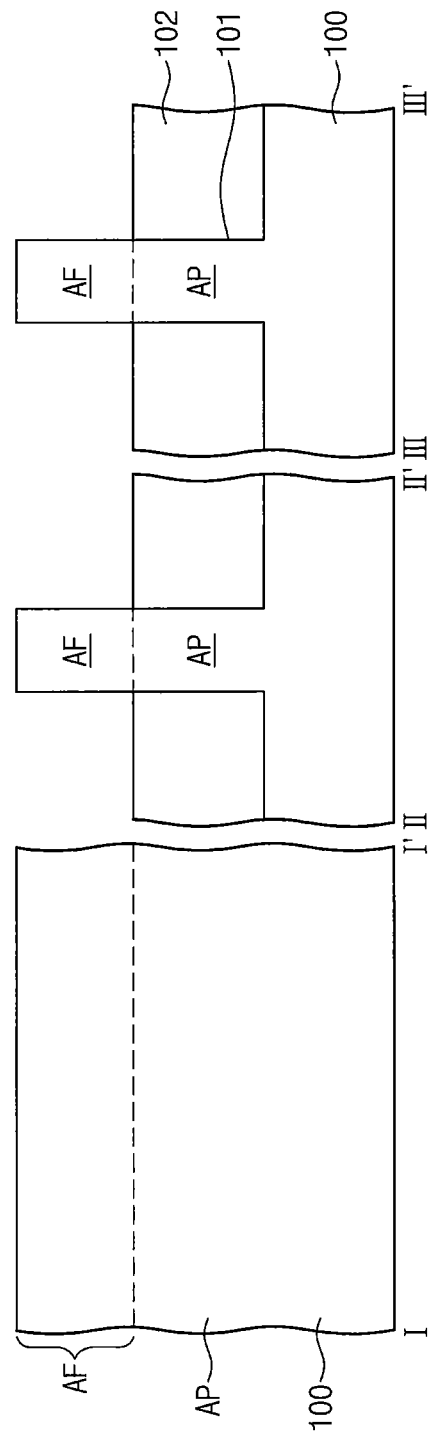

Referring to FIGS. 4A and 4B, trenches 101 may be formed on a substrate 100 to define an active pattern AP. The substrate 100 may be a semiconductor substrate. For example, the substrate 100 may be a silicon substrate, a germanium substrate, or a SOI substrate.

In some embodiments, the trenches 101 may be formed by patterning the substrate 100. In some embodiments, an epitaxial layer may be formed on the substrate 100, and the epitaxial layer may be patterned to form the trenches 101. The epitaxial layer may include a plurality of epitaxial layers having different lattice constants, and a compressive strain or a tensile strain may be applied to the active pattern AP. The patterning process for forming the trenches 101 may include forming a mask pattern (not shown) on the substrate 100, and performing an anisotropic etching process using the mask pattern as an etch mask. The trenches 101 may extend in a first direction D1 and may be spaced apart from each other in a second direction D2 intersecting the first direction D1, so the active pattern AP may extend in the first direction D1. In addition, the active pattern AP may protrude from the substrate 100 in a third direction D3 perpendicular to both the first and second directions D1 and D2. In some embodiments, a width of each of the trenches 101 may become narrower toward a bottom surface of each of the trenches 101, and thus, a width of the active pattern AP may become narrower toward a top surface of the active pattern AP. One active pattern AP is illustrated in FIGS. 4A and 4B. However, the inventive concepts are not limited thereto. In some embodiments, a plurality of the active patterns AP may be arranged along the second direction D2.

Device isolation patterns 102 may be formed in the trenches 101. The device isolation patterns 102 may be formed to expose an upper portion of the active pattern AP. The upper portion of the active pattern AP exposed by the device isolation patterns 102 may be defined as an active fin AF. For example, device isolation patterns 102 may include silicon oxide, silicon nitride, and/or silicon oxynitride.

Figure 5A:
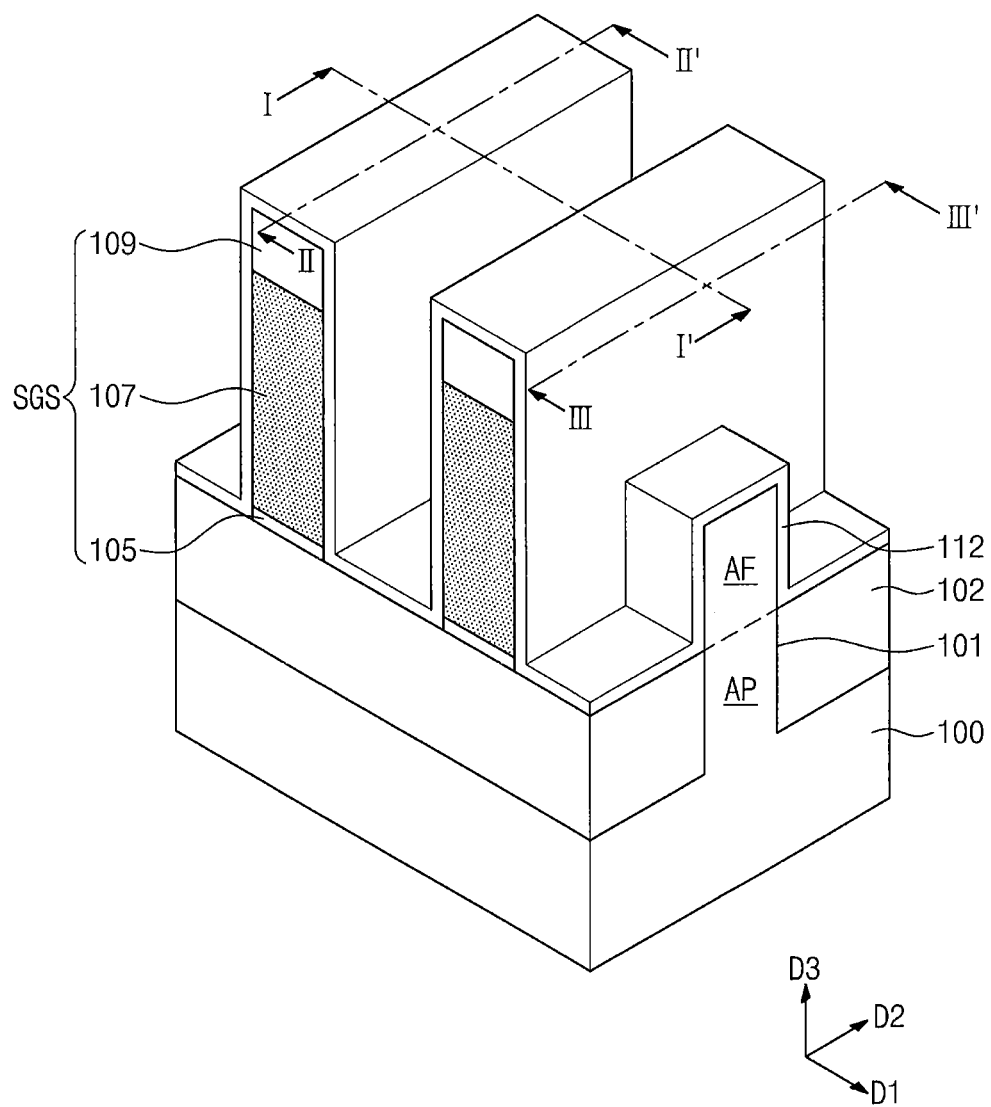
Figure 5B:
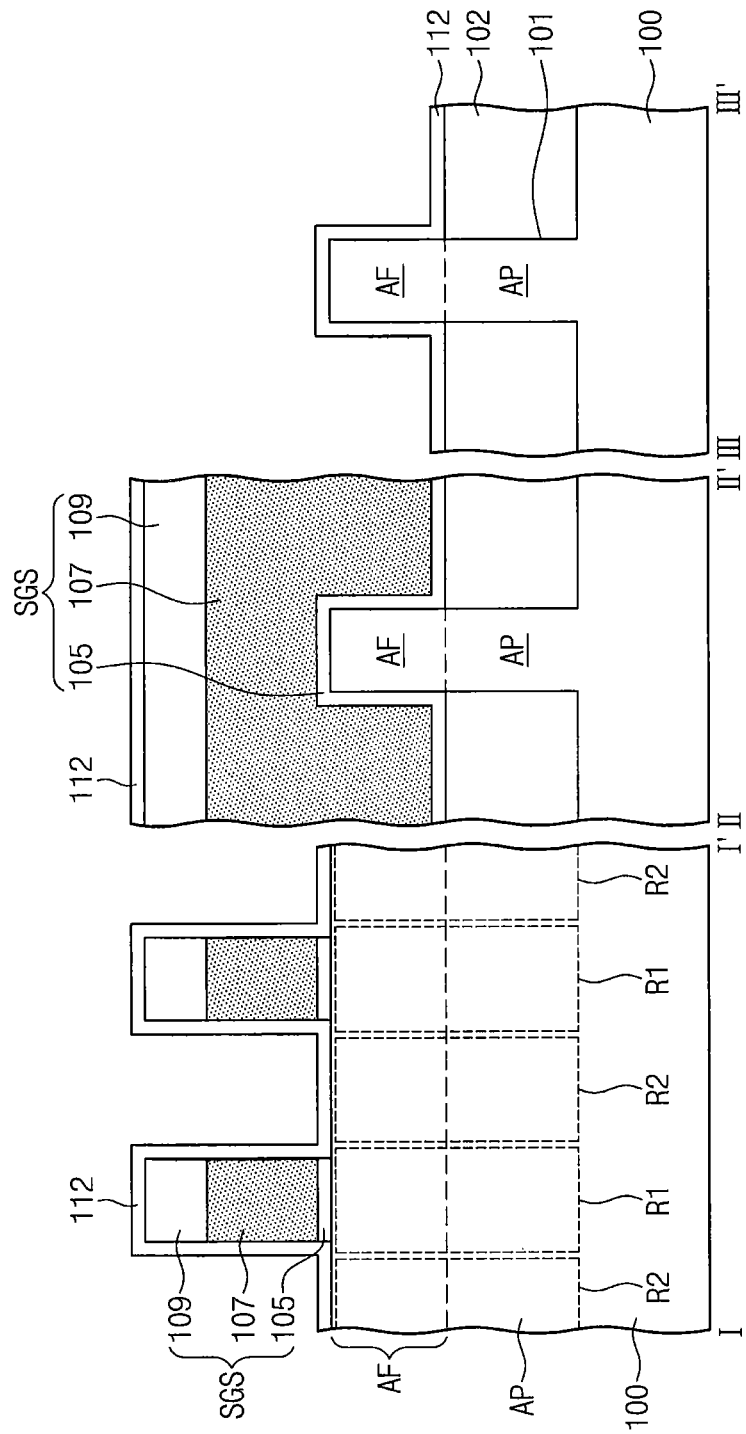

Referring to FIGS. 5A and 5B, an etch stop layer and a sacrificial gate layer may be sequentially formed on the substrate 100 to cover the active fin AF and the device isolation patterns 102. The etch stop layer may include, for example, a silicon oxide layer. The sacrificial gate layer may include a material having an etch selectivity with respect to the etch stop layer. The sacrificial gate layer may include, for example, a poly-silicon layer.

The sacrificial gate layer may be patterned to form a sacrificial gate pattern 107. The sacrificial gate pattern 107 may extend in the second direction D2 to intersect the active pattern AP. Forming the sacrificial gate pattern 107 may include forming a gate mask pattern 109 on the sacrificial gate layer, and etching the sacrificial gate layer using the gate mask pattern 109 as an etch mask. The gate mask pattern 109 may include, for example, silicon nitride. Etching the sacrificial gate layer may include performing an etching process having an etch selectivity with respect to the etch stop layer.

After the formation of the sacrificial gate pattern 107, the etch stop layer disposed at both sides of the sacrificial gate pattern 107 may be removed to form an etch stop pattern 105 under the sacrificial gate pattern 107. The etch stop pattern 105 may extend along a bottom surface of the sacrificial gate pattern 107 to cover a top surface and sidewalls of the active fin AF and top surfaces of the device isolation patterns 102. Here, the etch stop pattern 105, the sacrificial gate pattern 107, and the gate mask pattern 109 may be defined as a sacrificial gate structure SGS. As illustrated in FIGS. 5A and 5B, more than two sacrificial gate structures SGS may be provided on the substrate 100. The sacrificial gate structures SGS may be arranged along the first direction D1.

Since the sacrificial gate pattern 107 is formed to intersect the active pattern AP, a first region R1 and second regions R2 may be defined in the active pattern AP. The first region R1 may correspond to a portion of the active pattern AP which is disposed under the sacrificial gate structure SGS and overlaps with the sacrificial gate structure SGS. The second regions R2 may correspond to other portions of the active pattern AP which are disposed at both sides of the sacrificial gate structure SGS and are horizontally separated from each other by the first region R1. The first region R1 may vertically overlap with a first gate spacer SP1 of FIGS. 6A and 6B.

A first gate spacer layer 112 may be formed on the substrate 100 to conformally cover the sacrificial gate structures SGS. The first gate spacer layer 112 may have a substantially uniform thickness as illustrated in FIG. 5A. The first gate spacer layer 112 may cover top surfaces of the device isolation patterns 102 disposed at both sides of the sacrificial gate structure SGS, top surfaces and sidewalls of the second regions R2 disposed at both sides of the sacrificial gate structure SGS, and a top surface and sidewalls of the sacrificial gate structure SGS. For example, the first gate spacer layer 112 may be formed to have a thickness of about 1 nm to about 10 nm. The first gate spacer layer 112 may include, for example, a silicon nitride layer, a silicon oxynitride layer, or a silicon oxy-carbonitride layer. The first gate spacer layer 112 may be formed by a deposition process such as a chemical vapor deposition (CVD) process or an atomic layer deposition (ALD) process.

Figure 6A:
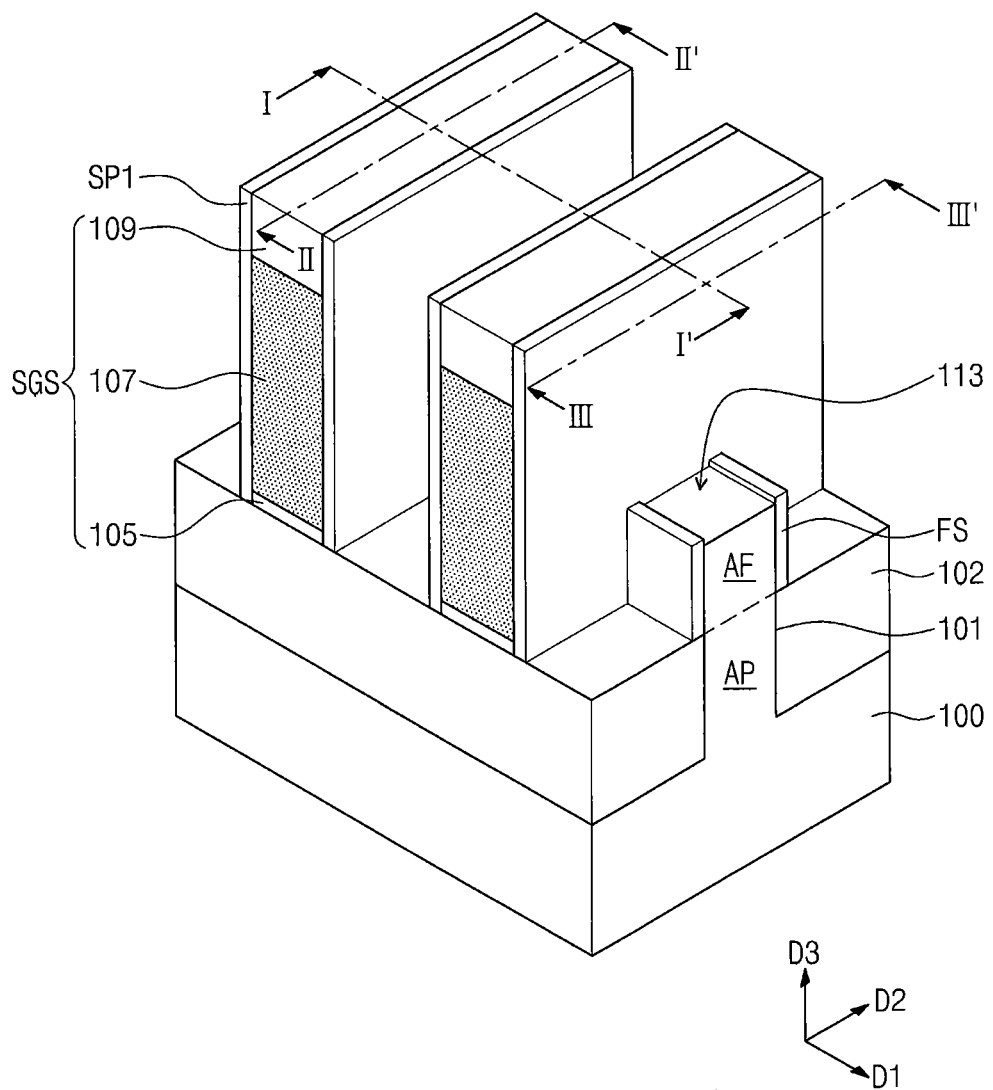
Figure 6B:
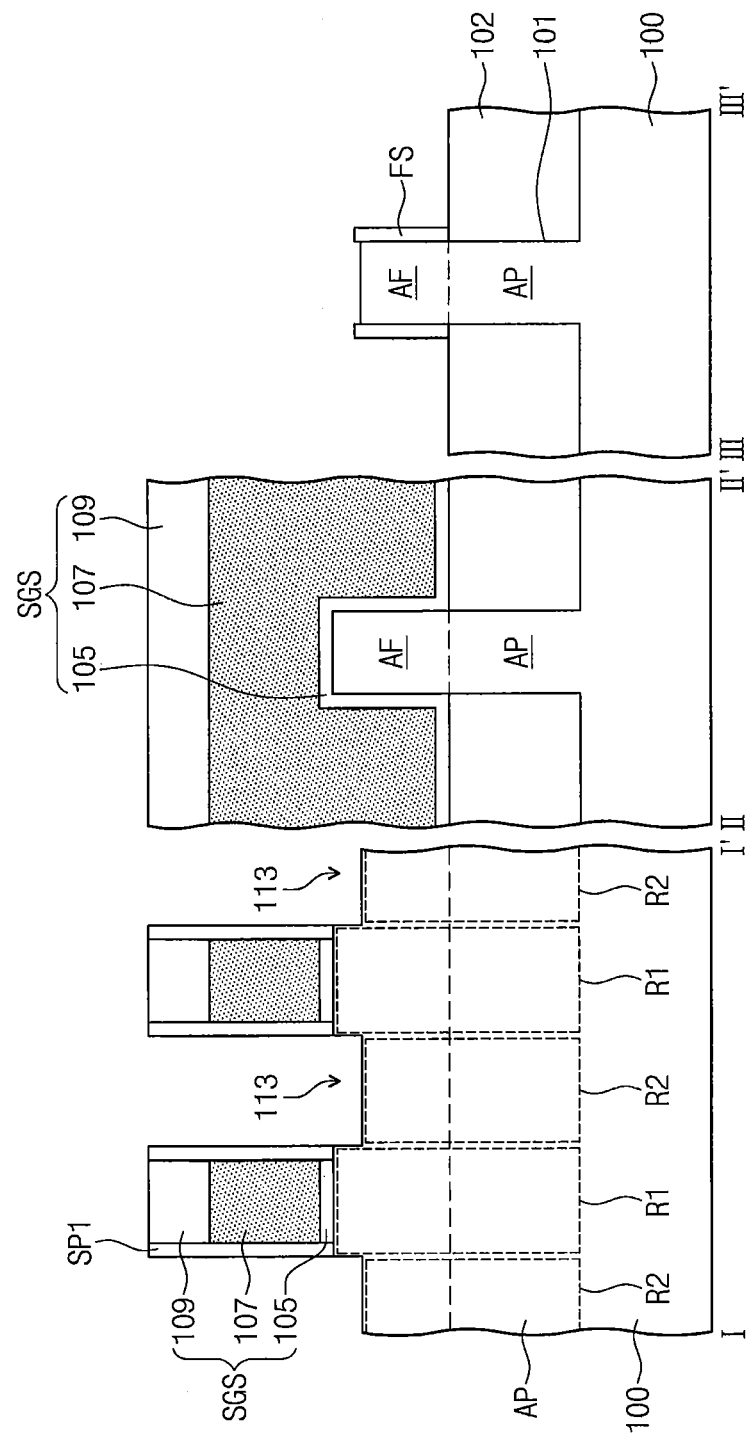

Referring to FIGS. 6A and 6B, the first gate spacer layer 112 may be patterned to form first gate spacers SP1 on sidewalls of the sacrificial gate structures SGS. The first gate spacer layer 112 may be patterned using, for example, an anisotropic etching process. The top surfaces of the second regions R2 of the active pattern AP and the top surfaces of the device isolation patterns 102 may be exposed by the anisotropic etching process. A portion of the gate mask pattern 109 may be etched during the anisotropic etching process. After the anisotropic etching process, a residual portion of the gate mask pattern 109 may remain on the sacrificial gate pattern 107. In addition, portions of the first gate spacer layer 112 may remain on both sidewalls of each of the second regions R2.

Subsequently, upper portions of the active pattern AP at both sides of each of the sacrificial gate structures SGS may be removed. In other words, portions of the second regions R2 of the active pattern AP may be removed. Removing the portions of the second regions R2 may be performed using an anisotropic etching process. Thus, first preliminary recess regions 113 may be formed in the active pattern AP at both sides of each of the sacrificial gate structures SGS. The sacrificial gate structures SGS and the first gate spacers SP1 may be used as an etch mask for the anisotropic etching process. Bottom surfaces of the first preliminary recess regions 113 may be defined by recessed top surfaces of the second regions R2. In some embodiments, the recessed top surfaces of the second regions R2 may be lower than a top surface of the first region R1 and may be higher than the top surfaces of the device isolation patterns 102 as illustrated in FIG. 6A. If the top surfaces of the device isolation patterns 102 are curved surfaces, the recessed top surfaces of the second regions R2 may be higher than the topmost ends of the device isolation patterns 102. Recessed depths of the second regions R2 may be varied. Sidewalls of the first preliminary recess regions 113 may be aligned with outer surfaces of the first gate spacers SP1. The sidewalls of the first preliminary recess regions 113 may be spaced apart from the sides of each of the sacrificial gate structures SGS by the thickness of the first gate spacer layer 112 (e.g., about 1 nm to 10 nm). In some embodiments, the sidewalls of the first preliminary recess regions 113 may be substantially perpendicular to the top surface of the substrate 100 (i.e., a lowermost surface of the sacrificial gate structures SGS) as illustrated in FIG. 6B.

In some embodiments, removing the portions of the second regions R2 may include etching the second regions R2 using an etch recipe having a relatively high etch-selectivity with respect to the first gate spacer layer 112. In other words, an etched amount of the first gate spacer layer 112 may be relatively small during the etching process for removing the portions of the second regions R2. Thus, residual portions of the first gate spacer layer 112 may remain on sidewalls of the recessed second regions R2 after the etching process. The residual portions of the first gate spacer layer 112 may be referred to as 'fin spacers FS'. In some embodiments, top surfaces (or the topmost ends) of the fin spacers FS may be higher than the recessed top surfaces of the second regions R2 and lower than the top surfaces of the first regions R1. Heights of the top surfaces of the fin spacers FS may be varied according to recessed depths of the second regions R2 and/or a process recipe (e.g., an etch-selective ratio) of the etching process for removing the portions of the second regions R2. The first gate spacers SP1 and the gate mask patterns 109 may be partially etched during the etching process for removing the portions of the second regions R2.

Figure 7A:
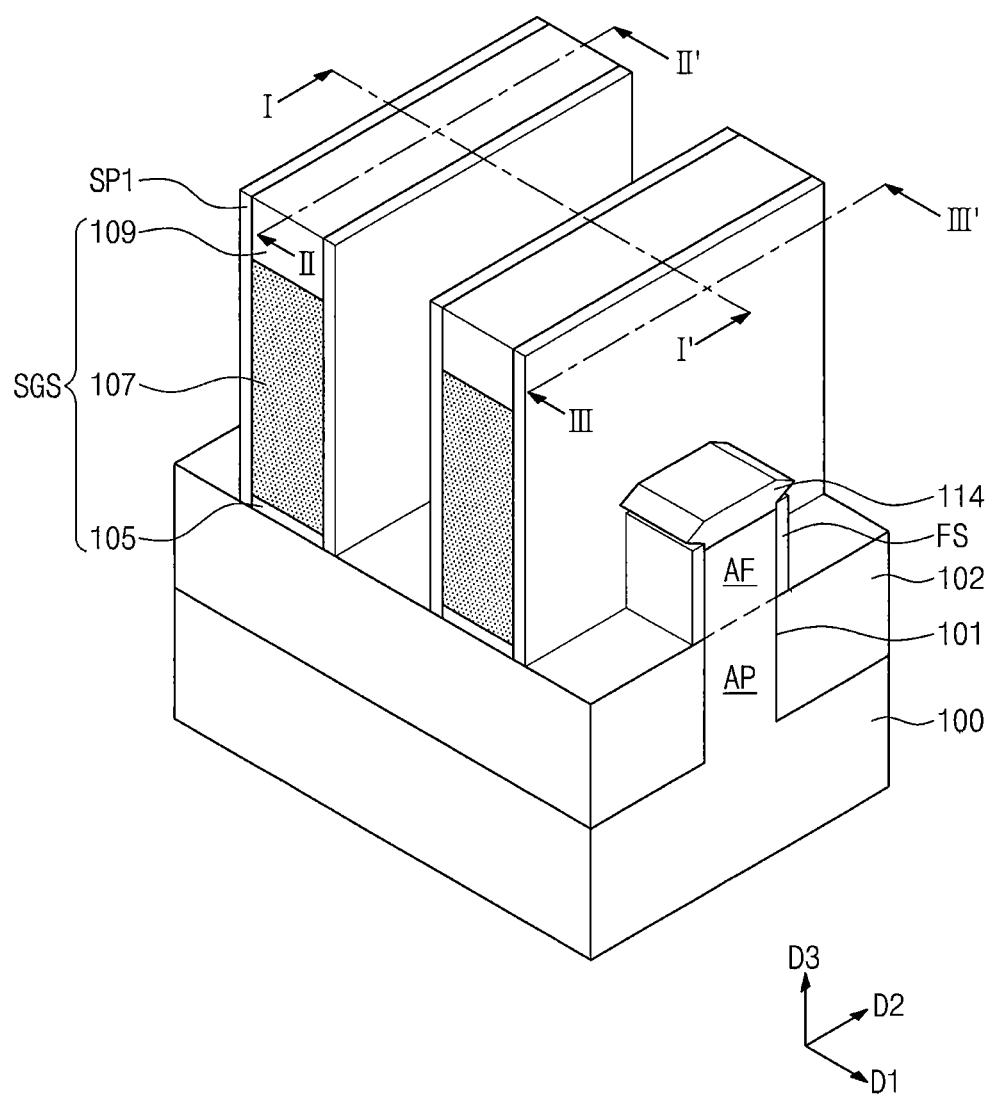
Figure 7C:
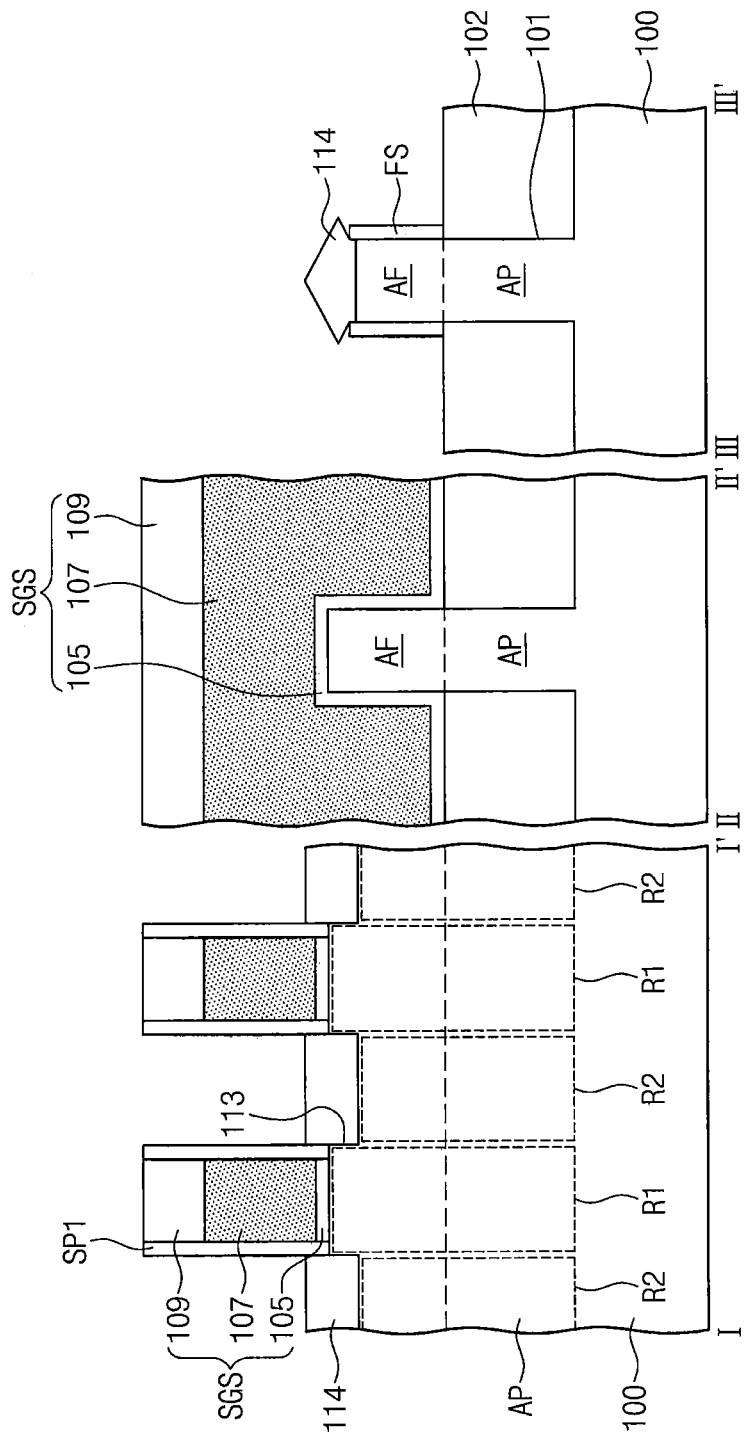
FIG. 7C is a cross-sectional view taken along the lines I-I', II-II', and III-III' of FIG. 7A.

Referring to FIGS. 7A and 7B, sacrificial filling patterns 114 may be formed in the first preliminary recess regions 113, respectively. The sacrificial filling patterns 114 may be formed of a material having an etch selectivity with respect to the active pattern AP. In some embodiments, an etch rate of the sacrificial filling patterns 114 by an etchant may be higher than an etch rate of the active pattern AP by the etchant. For example, if the active pattern AP includes silicon (Si), the sacrificial filling patterns 114 may be formed of silicon-germanium (SiGe). At this time, a germanium concentration of the sacrificial filling pattern 114 may be in a range of about 5 atm % to about 30 atm %. However, the inventive concepts are not limited thereto. The germanium concentration may be variously controlled to realize a desired ratio of the etch rate of the sacrificial filling patterns 114 to the etch rate of the active pattern AP.

According to some embodiments, the sacrificial filling pattern 114 may be formed by an epitaxial growth process. In other word, the sacrificial filling pattern 114 may be formed by a selective epitaxial growth (SEG) process using the active pattern AP, exposed by each of the first preliminary recess regions 113, as a seed. In some embodiments, the sacrificial filling pattern 114 may fill an entire portion of the first preliminary recess region 113. Thus, a top surface of the sacrificial filling pattern 114 may be disposed at the same height as or a higher height than the top surface of the first region R1. The top surface of the sacrificial filling pattern 114 may be substantially coplanar with the top surface of the substrate 100 as illustrated in FIG. 7B. However, the inventive concepts are not limited thereto. In some embodiments, the sacrificial filling patterns 114 may partially fill the respective first preliminary recess regions 113. A lower portion of the sacrificial filling pattern 114 may be in contact with the fin spacers FS, and an upper portion of the sacrificial filling pattern 114 may be disposed at a higher level than the top surfaces of the fin spacers FS. A width, in the second direction D2, of the lower portion of the sacrificial filling pattern 114 may correspond to a distance between the fin spacers FS. The upper portion of the sacrificial filling pattern 114 may have wedge-shaped sidewalls that are laterally tapered. The maximum width of the upper portion of the sacrificial filling pattern 114 may be greater than the width of the lower portion of the sacrificial filling pattern 114. The shape of the upper portion of the sacrificial filling pattern 114 may be the substantially same as the shape of the upper portion UP of the second portion 124 of the source/drain region SD described with reference to FIG. 1C.

In some embodiments, the sacrificial filling pattern 114 may protrude upward from the top surface of the first region R1, and the top surface of the sacrificial filling pattern 114 may have an upwardly tapered wedge-shape as illustrated in FIG. 7C. In this case, the shape of the upper portion of the sacrificial filling pattern 114 may be the substantially same as the shape of the upper portion UP of the second portion 124 of the source/drain region SD described with reference to FIG. 3. The shape of the sacrificial filling pattern 114 may vary according to the recessed depth of the second region R2, the height of the fin spacer FS, and/or a grown amount of the sacrificial filling pattern 114. Hereinafter, the resultant structure of FIGS. 7A and 7B will be described as an example for the purpose of ease and convenience in explanation. However, the inventive concepts are not limited thereto. The following processes of the manufacture method may also be applied to the resultant structure of FIG. 7C.

Figure 8A:
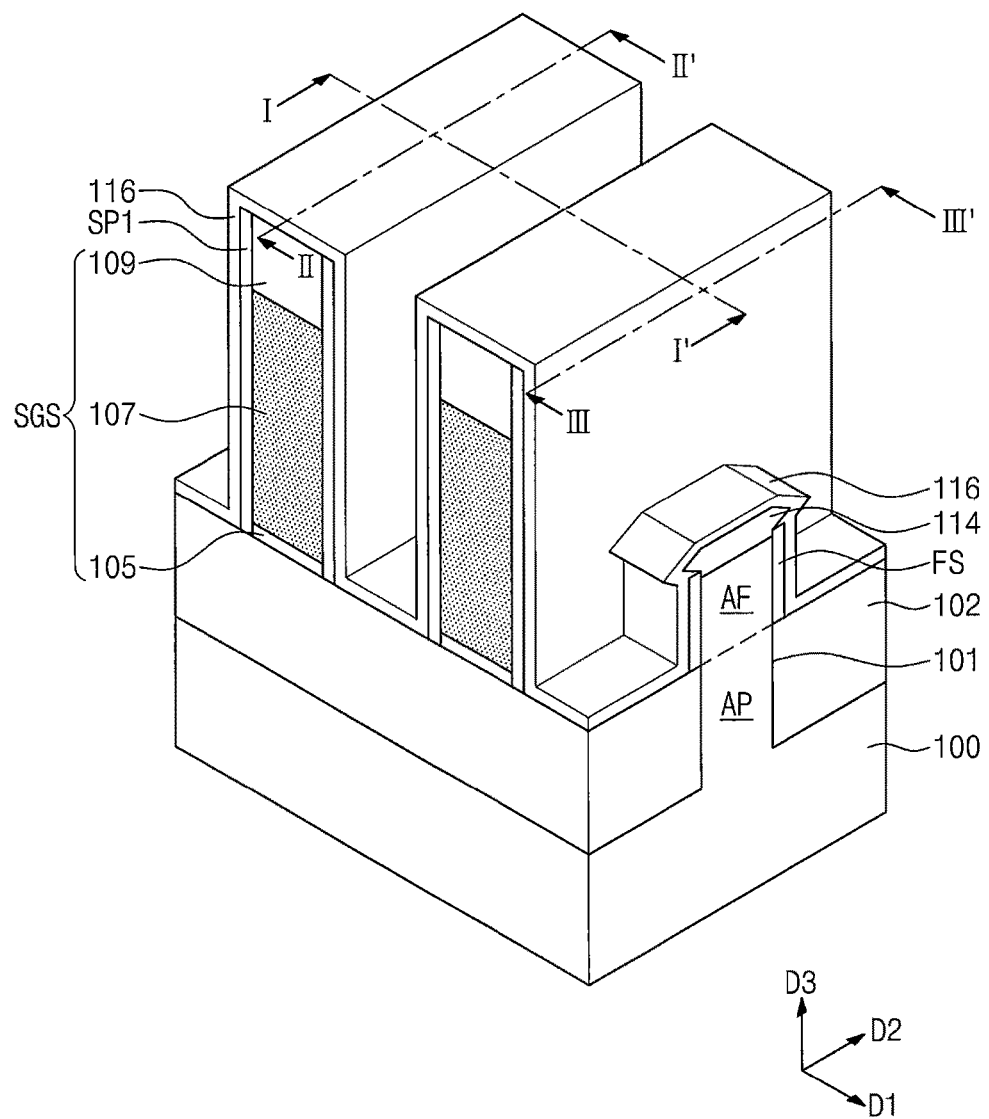
Figure 8B:
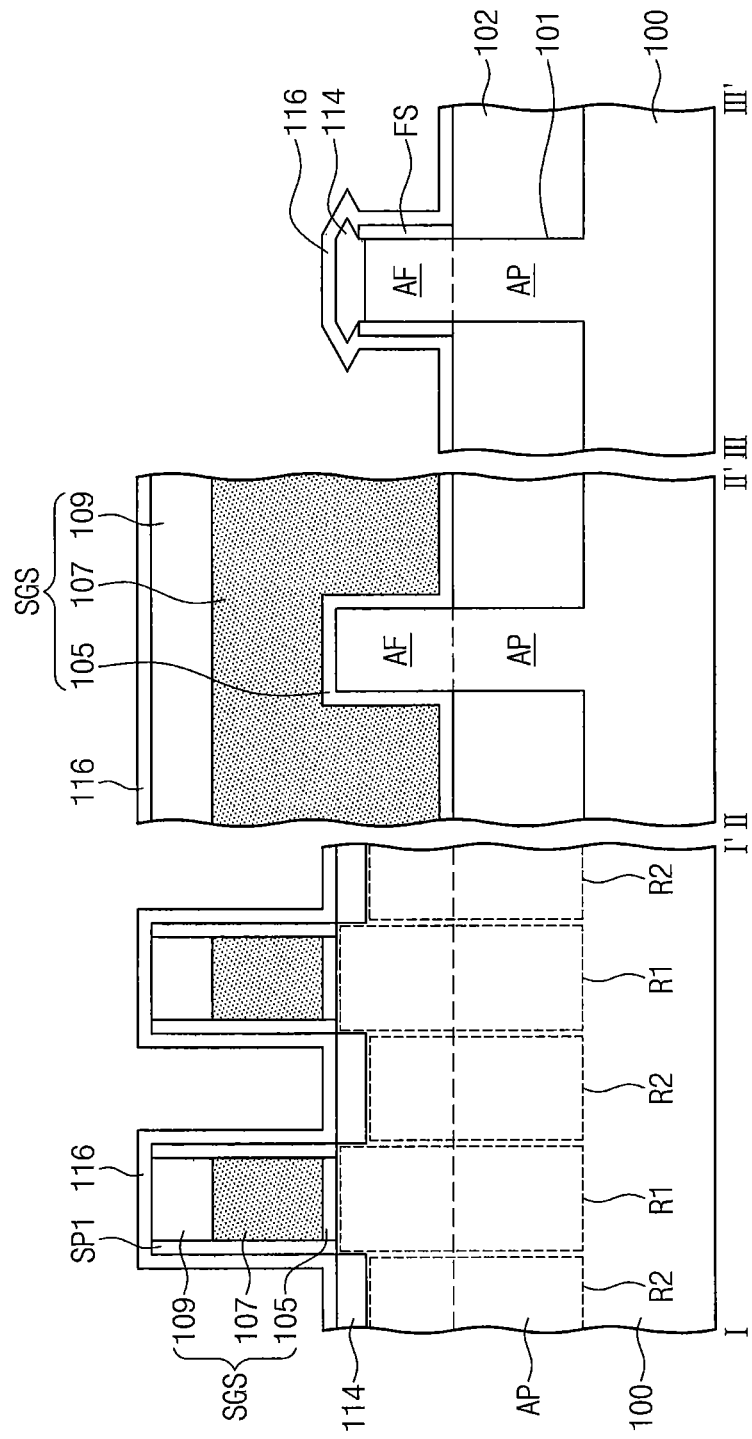

Referring to FIGS. 8A and 8B, a second gate spacer layer 116 may be conformally formed on the resultant structure of FIGS. 7A and 7B. In other word, the second gate spacer layer 116 may conformally cover the resultant structure having the sacrificial filling patterns 114. A thickness of the second gate spacer layer 116 may be equal to or greater than that of the first gate spacer layer 112. For example, the thickness of the second gate spacer layer 116 may be in a range of about 1 nm to about 50 nm. In some embodiments, the second gate spacer layer 116 may be formed of the same material as the first gate spacer layer 112. For example, the second gate spacer layer 116 may include a silicon nitride layer, a silicon oxynitride layer, or a silicon oxy-carbonitride layer. In some embodiments, the second gate spacer layer 116 may be formed of a different material from the first gate spacer layer 112. For example, the first gate spacer layer 112 may include a silicon oxy-carbonitride layer, and the second gate spacer layer 116 may include a silicon nitride layer. The second gate spacer layer 116 may be formed by the same method as the first gate spacer layer 112.

Figure 9A:
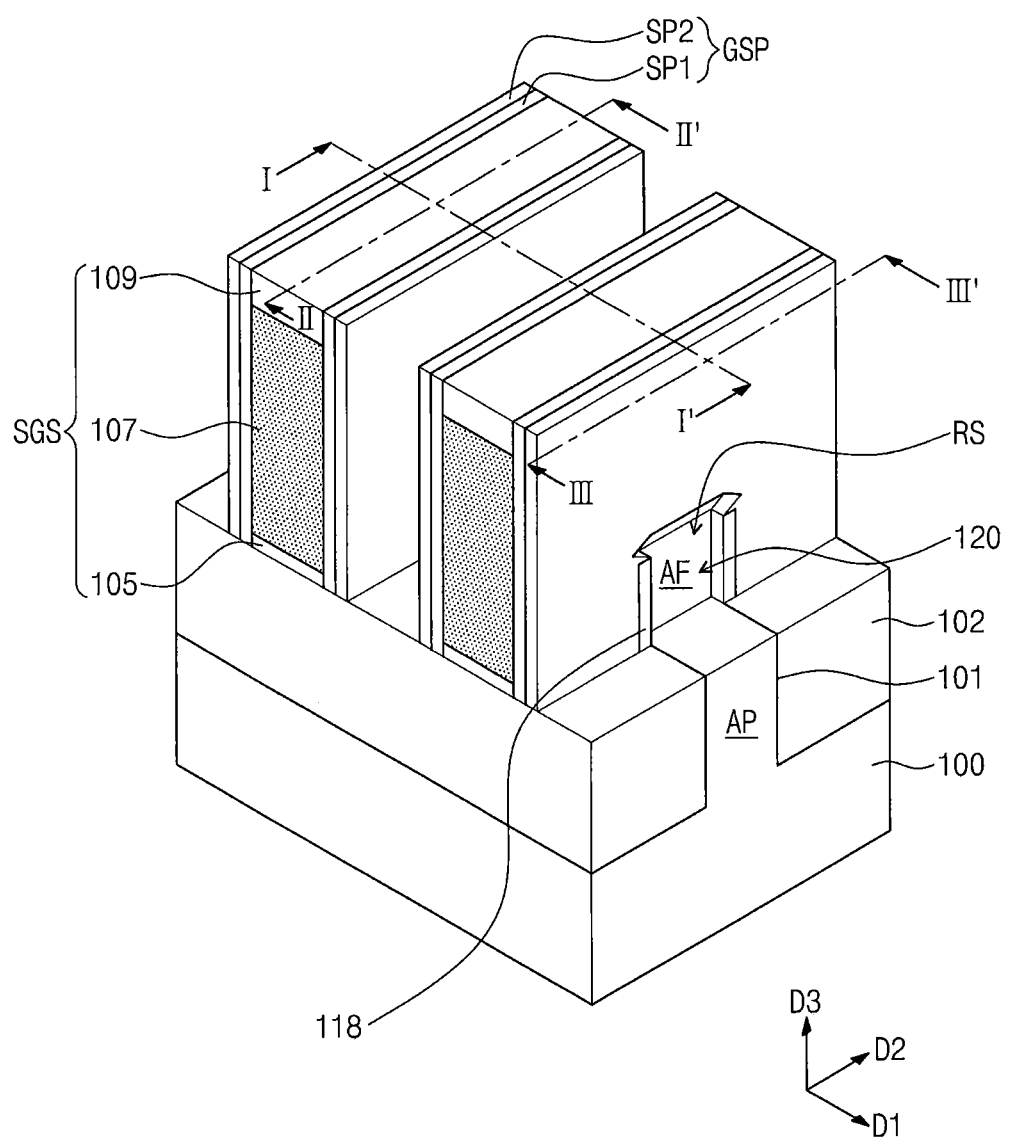
Figure 9B:
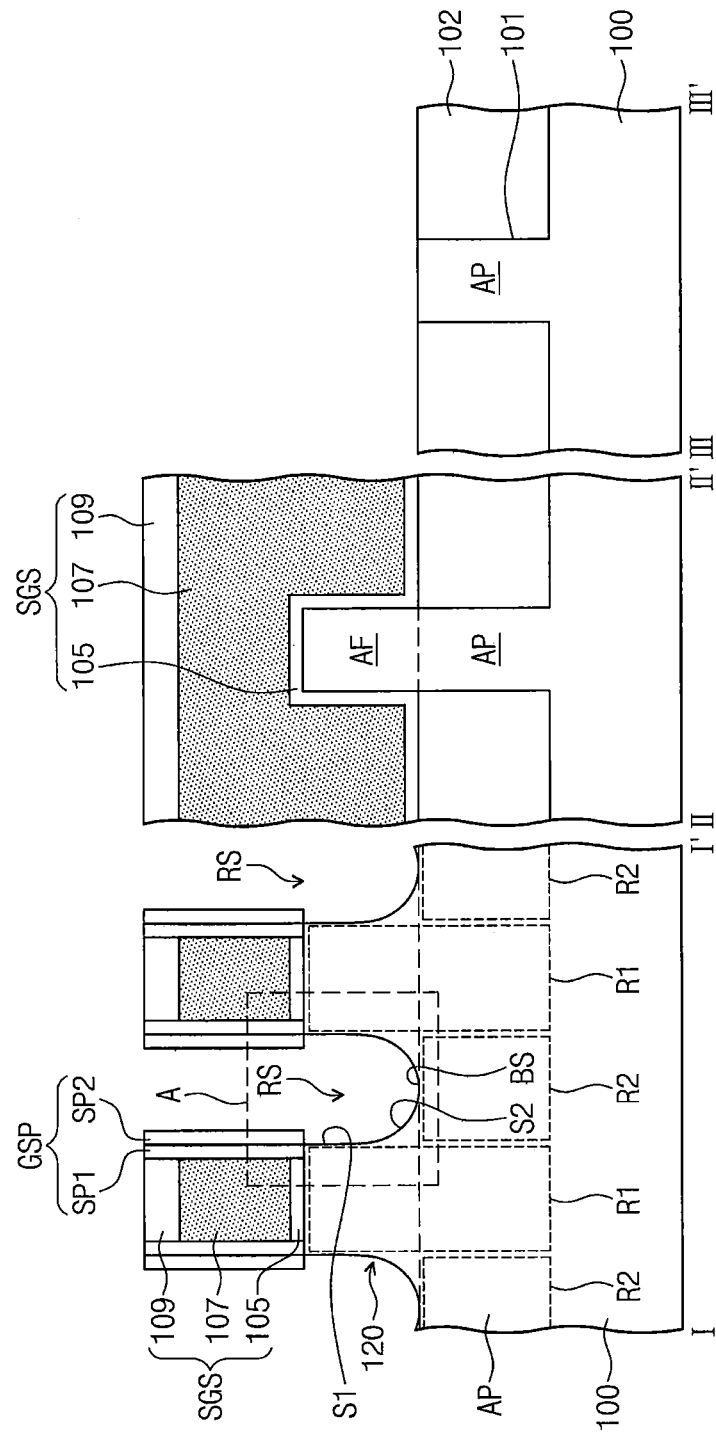
Figure 9C:
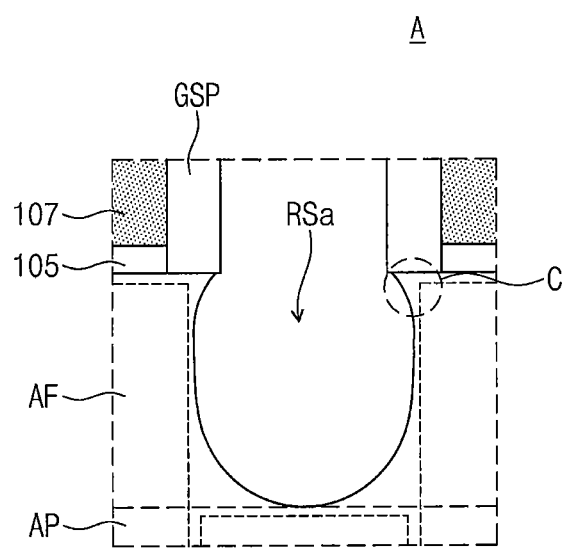
FIG. 9C is an enlarged view of the portion 'A' of FIG. 9B.
Figure 9D:
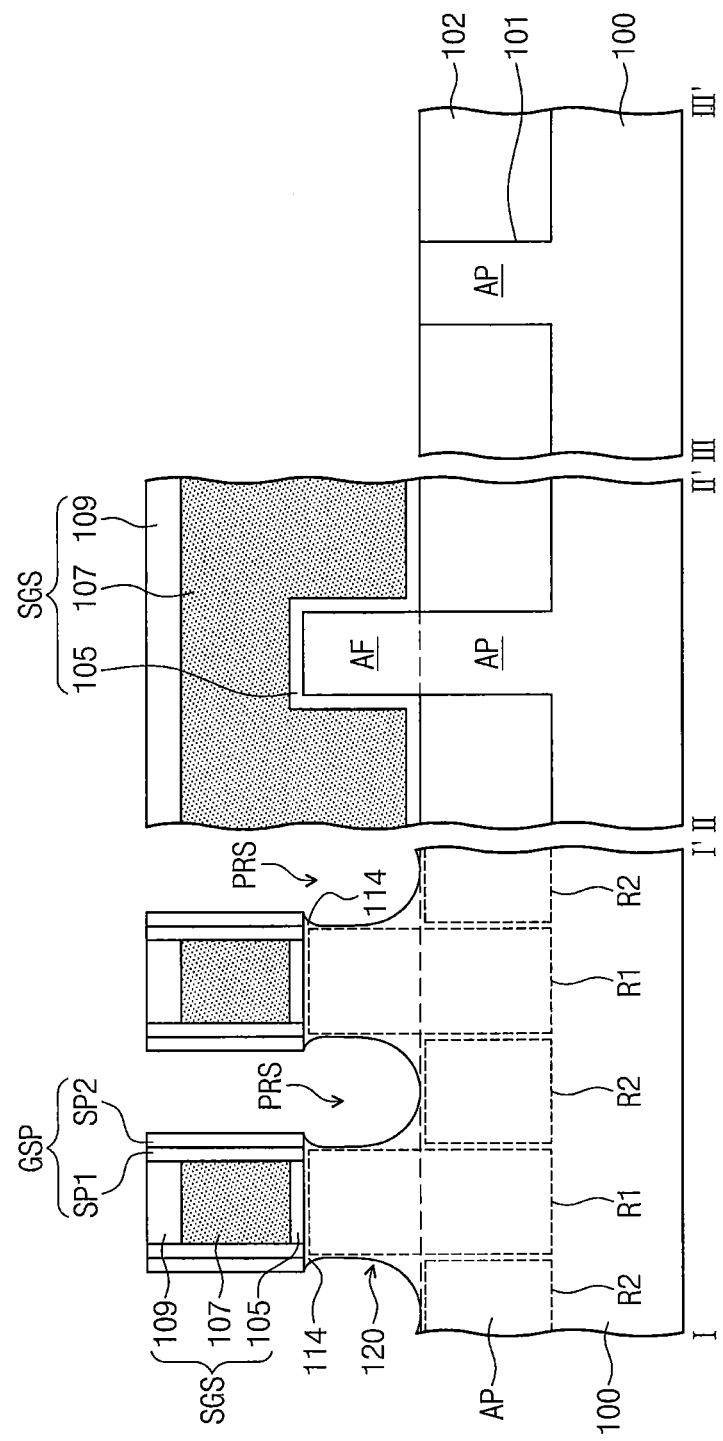
FIG. 9D is cross-sectional views taken along the lines I-I', II-II', and III-III' of FIG. 9A.

Referring to FIGS. 9A and 9B, the second gate spacer layer 116 may be patterned to form a second gate spacer SP2 on the sidewall of the first gate spacer SP1. The second gate spacer layer 116 may be patterned using an anisotropic etching process. The top surfaces of the sacrificial filling patterns 114 and the top surfaces of the device isolation patterns 102 may be exposed by the anisotropic etching process. The first and second gate spacers SP1 and SP2 may be defined as a gate spacer GSP.

Recess regions RS may be formed in the active pattern AP at both sides of each of the sacrificial gate structures SGS as illustrated in FIG. 9B. According to some embodiments, forming the recess regions RS may include performing a series of etching processes including an anisotropic etching process and an isotropic etching process using the sacrificial gate structures SGS and the first and second gate spacers SP1 and SP2 as an etch mask. The sacrificial filling pattern 114 may be etched in a depth direction by the anisotropic etching process to expose the second region R2 of the active pattern AP. In addition, the sacrificial filling pattern 114 may also be etched in a lateral direction toward the active fin AF by the isotropic etching process. In some embodiments, the sacrificial filling pattern 114 may be entirely etched as illustrated in FIG. 9B such that the sidewalls of the first preliminary recess regions 113 of FIG. 6B may be exposed. In some embodiments, the sacrificial filling pattern 114 may partially remain. The second region R2 of the active pattern AP may also be etched in the depth direction and in the lateral direction toward the active fin AF by the anisotropic etching process and the isotropic etching process. As a result, the recess region RS having an undercut region 120 disposed under the gate spacer GSP may be formed. In some embodiments, the sacrificial filling pattern 114 may be etched faster than the second region R2 of the active pattern AP during the series of etching processes, and the recess region RS may thus have a U-shaped cross-section having uppermost sidewalls that are substantially perpendicular to the top surface of the substrate 100 (i.e., a lowermost surface of the sacrificial gate structures SGS) as illustrated in FIG. 9B.

As appreciated by the present inventors, if the sacrificial filling pattern 114 is not formed on the second region R2 of the active pattern AP, the recess region RS may not have a U-shaped cross-section having uppermost sidewalls that are substantially perpendicular to the top surface of the substrate 100. FIG. 9C is an enlarged view of the portion 'A' of FIG. 9B. As illustrated in FIG. 9C, if the sacrificial filling pattern 114 is not formed, the second region R2 of the active pattern AP may be etched by a series of etching processes including an anisotropic etching process and an isotropic etching process to form a recess region RSa. Etchants of the series of etching processes may not easily reach to a portion of the active pattern AP disposed immediately beneath the gate spacer GSP, and the portion of the active pattern AP disposed immediately beneath the gate spacer GSP may remain as marked by circle C in FIG. 9C. It will be understood that a portion of the sacrificial filling pattern 114 disposed immediately beneath the gate spacer GSP may be etched even though only limited amount of the etchants reach to the portion of the sacrificial filling pattern 114 since the etchants may etch the sacrificial filling pattern 114 faster than the active pattern AP.

Referring again to FIG. 9B, the recess region RS may have an upper portion having a uniform width and a lower portion having a width becoming narrower toward a bottom surface of the recess region RS, when viewed from a cross-section taken along the first direction D1. The upper portion of the recess region RS may be defined by first sidewalls S1 substantially perpendicular to the top surface of the substrate 100, and the lower portion of the recess region RS may be defined by second sidewalls S2 and a bottom surface BS connected to the second sidewalls S2. The first sidewall Si of the recess region RS may be recessed toward the sacrificial gate structure SGS relative to an outer surface of the second gate spacers SP2 as illustrated in FIG. 9B. The second sidewalls S2 may be rounded. The second sidewalls S2 may have convex surfaces toward lower portions of the active fins AF adjacent to each other. The bottom surface BS of the recess region RS may be disposed at the substantially same level as the top surfaces (or the topmost ends) of the device isolation patterns 102. However, the inventive concepts are not limited thereto. The undercut region 120 may have the substantially same shape as the second portion 124 of the source/drain region SD described with reference to FIG. 1C. The shape of the undercut region 120 may be changed according to the shape of the sacrificial filling pattern 114 described above.

The second gate spacer layer 116 and the fin spacers FS disposed on the sidewalls of the second region R2 may be removed during the formation of the recess regions RS. In some embodiments, the second gate spacer layer 116 disposed on the sidewalls of the second regions R2 may be completely removed, but portions of the fin spacers FS may remain under the second gate spacers SP2. After the formation of the recess regions RS, the portions of the fin spacers FS remaining under the second gate spacers SP2 may be defined as residual spacers 118. The gate mask pattern 109 and the first and second gate spacers SP1 and SP2 may partially etched during the formation of the recess regions RS.

FIG. 9D is cross-sectional views taken along the lines I-I', II-II', and III-III' of FIG. 9A. Referring to FIG. 9D, portions of the sacrificial filling pattern 114 that are beneath the second gate spacers SP2 may not be removed by a series of etching processes including an anisotropic etching process and an isotropic etching process that are performed to remove the sacrificial filling pattern 114 and the second region R2 of the active pattern AP. Accordingly, preliminary recess regions PRS may be formed at both sides of each of the sacrificial gate structures SGS. The preliminary recess region PRS may extend through the sacrificial filling pattern 114. The portions of the sacrificial filling pattern 114 that remain beneath the second gate spacers SP2 may be removed by performing an isotropic etching process that selectively removes the sacrificial filling pattern 114 to form the recess regions RS of FIG. 9B. For example, the active pattern AP may include silicon (Si), the sacrificial filling pattern 114 may include silicon-germanium (SiGe), and the isotropic etching process may be a wet etching process using an etchant that includes peracetic acid ($C_2H_4O_3$) and hydrofluoric acid (HF). The etchant including peracetic acid ($C_2H_4O_3$) and hydrofluoric acid (HF) may etch the sacrificial filling pattern 114 including silicon-germanium about 10 to about 100 times faster than the active pattern AP including silicon. The etch rate of the sacrificial filling pattern 114 including silicon-germanium may vary according to a germanium content of the sacrificial filling pattern 114.

Figure 10A:
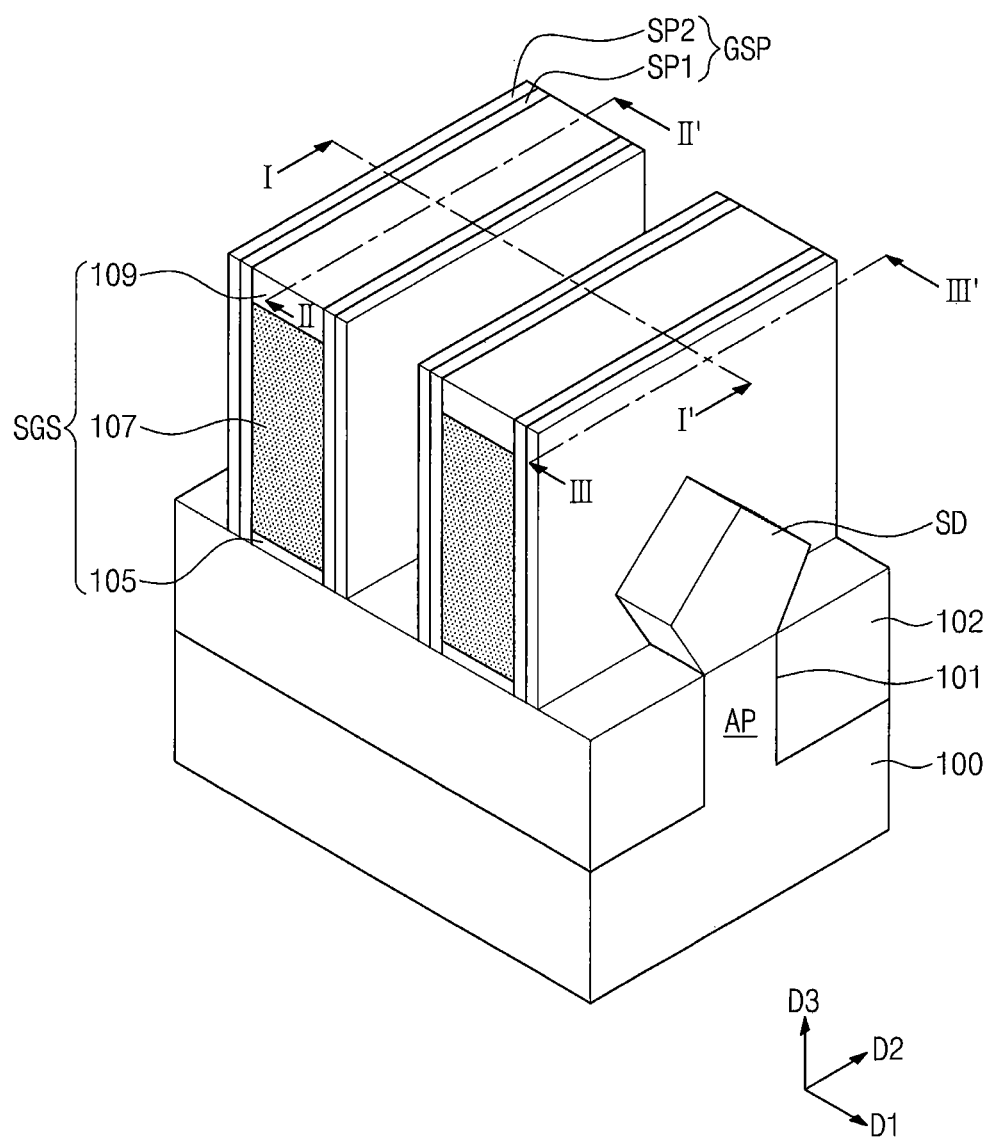
Figure 10B:
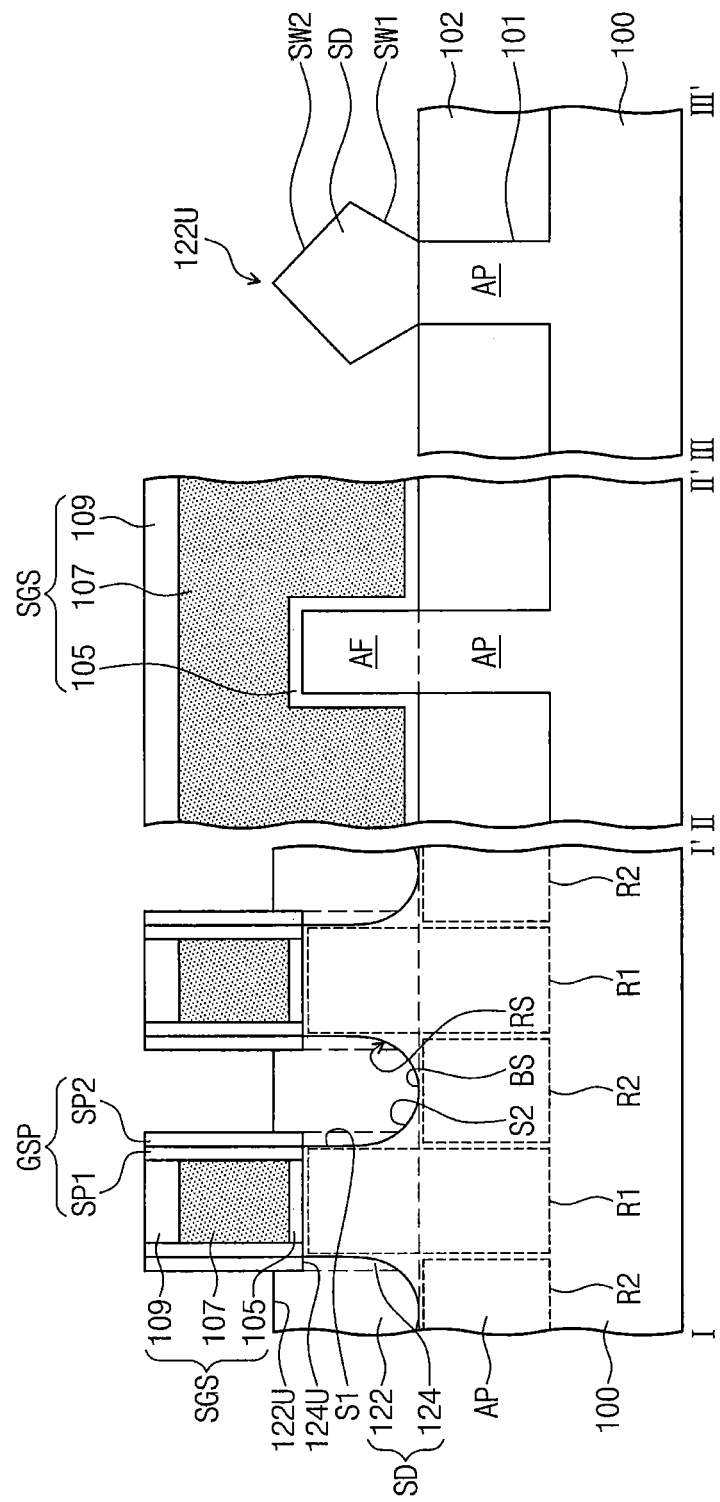

Referring to FIGS. 10A and 10B, source/drain regions SD may be formed on inner surfaces of the recess regions RS, respectively. According to some embodiments, the source/drain regions SD may be formed by a SEG process using the active pattern AP, exposed by the recess regions RS, as a seed. In some embodiments, each of the source/drain regions SD may include an epitaxial layer. For example, each of the source/drain regions SD may include at least one of silicon-germanium (SiGe), silicon (Si) and silicon carbide (SiC) which are epitaxial-grown from the active pattern AP exposed by the recess region RS. Thus, the source/drain regions SD may apply a compressive strain or a tensile strain to the active fins AF. The source/drain regions SD may be doped with dopants during or after the SEG process. The source/drain regions SD may be doped with P-type or N-type dopants.

According to some embodiments, at least one of the source/drain regions SD may be formed of a multi-layered epitaxial layer, as described with reference to FIGS. 2A and 2B. In other word, at least one of the source/drain regions SD may include first, second and third epitaxial layers EP1, EP2 and EP3 which are sequentially formed. The first to third epitaxial layers EP1, EP2 and EP3 may be continuously formed in the same chamber.

Each of the source/drain regions SD may fully fill the recess region RS including the undercut region 120. In some embodiments, the source/drain regions SD may protrude upward from the top surface of the active fin AF. A shape of each of the source/drain regions SD may correspond to the shape of the recess region RS, when viewed from a cross-section taken along the first direction D1. In more detail, each of the source/drain regions SD may have upper sidewalls substantially perpendicular to the top surface of the substrate 100 and lower sidewalls having convex surfaces toward the channel regions CH, when viewed from a cross-section taken along the first direction D1. The upper sidewalls of the source/drain region SD may be defined by the first sidewalls S1 of the recess region RS, and the lower sidewalls of the source/drain region SD may be defined by the second sidewalls S2 of the recess region RS. The first sidewalls S1 may be recessed toward the sacrificial gate structures SGS relative to the outer surface of the second gate spacers SP2. As a result, an interface of the active pattern AP and the source/drain region SD may have a U-shaped cross-section having uppermost portions that are substantially perpendicular to the top surface of the substrate 100, when viewed from a cross-section taken along the first direction D1. This means that electrical characteristics of the semiconductor device may be improved. In some embodiments, the first sidewalls S1 may be aligned with the outer surface of the first gate spacers SP1 as illustrated in FIG. 10B.

Each of the source/drain regions SD may include a first portion 122 exposed by the gate spacers GSP, and second portions 124 extending from the first portion 122 as illustrated in FIG. 10B. The second portions 124 may be covered by the gate spacers GSP. In other word, the first portion 122 may not vertically overlap with the gate spacers GSP, but the second portions 124 may vertically overlap with the gate spacers GSP. In other word, the second portion 124 may correspond to a portion of the source/drain region SD that fills the undercut region 120. Thus, a shape of the second portion 124 may correspond to the shape of the undercut region 120.

The first portion 122 may have first sidewalls SW1 and second sidewalls SW2 slanted with respect to the top surface of the substrate 100 when viewed from a cross-section taken along the second direction D2. The first sidewalls SW1 may diverge toward the topmost end 122U of the first portion 122 and the second sidewalls SW2 may converge toward the topmost end 122U of the first portion 122 as illustrated in FIG. 10B. One end of the first sidewall SW1 may be connected to one end of the second sidewall SW2. In some embodiments, the topmost end 122U of the first portion 122 may be higher than the top surfaces of the active fins AF.

Figure 11A:
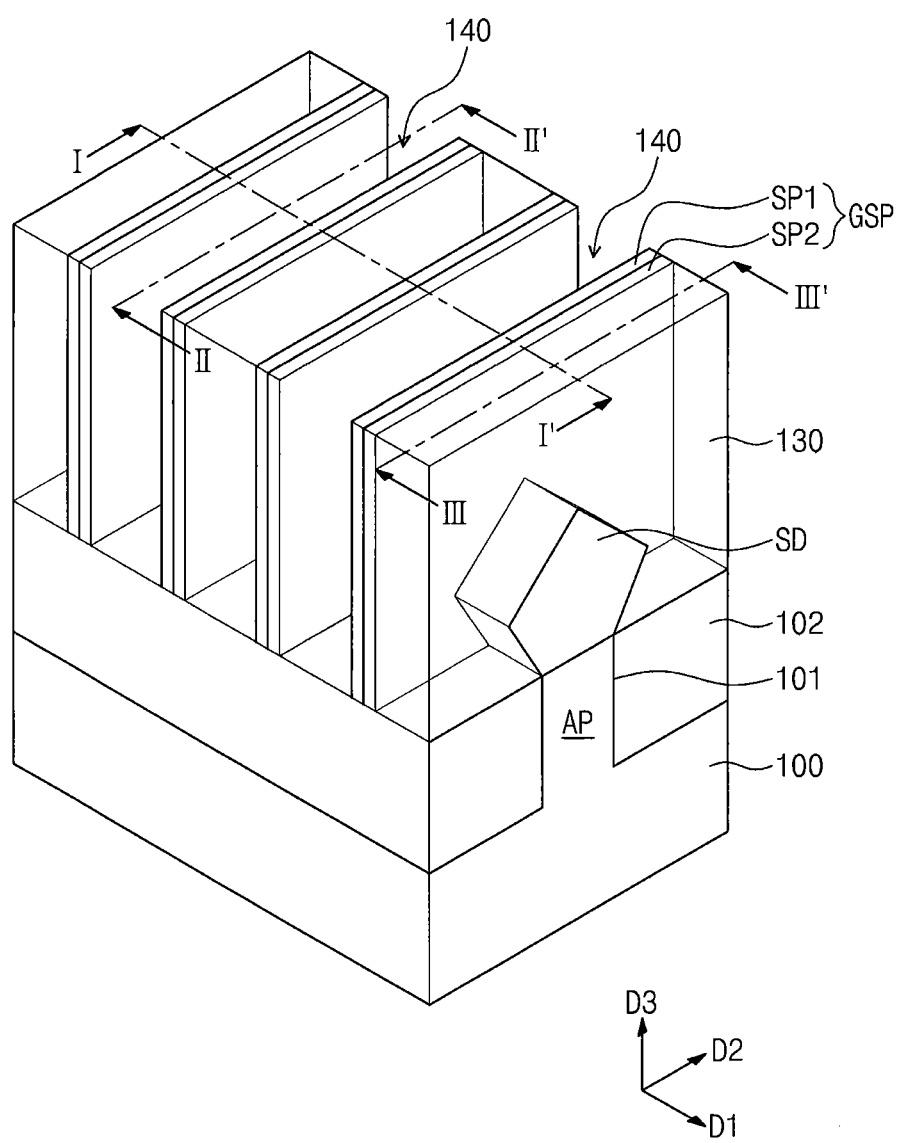
Figure 11B:
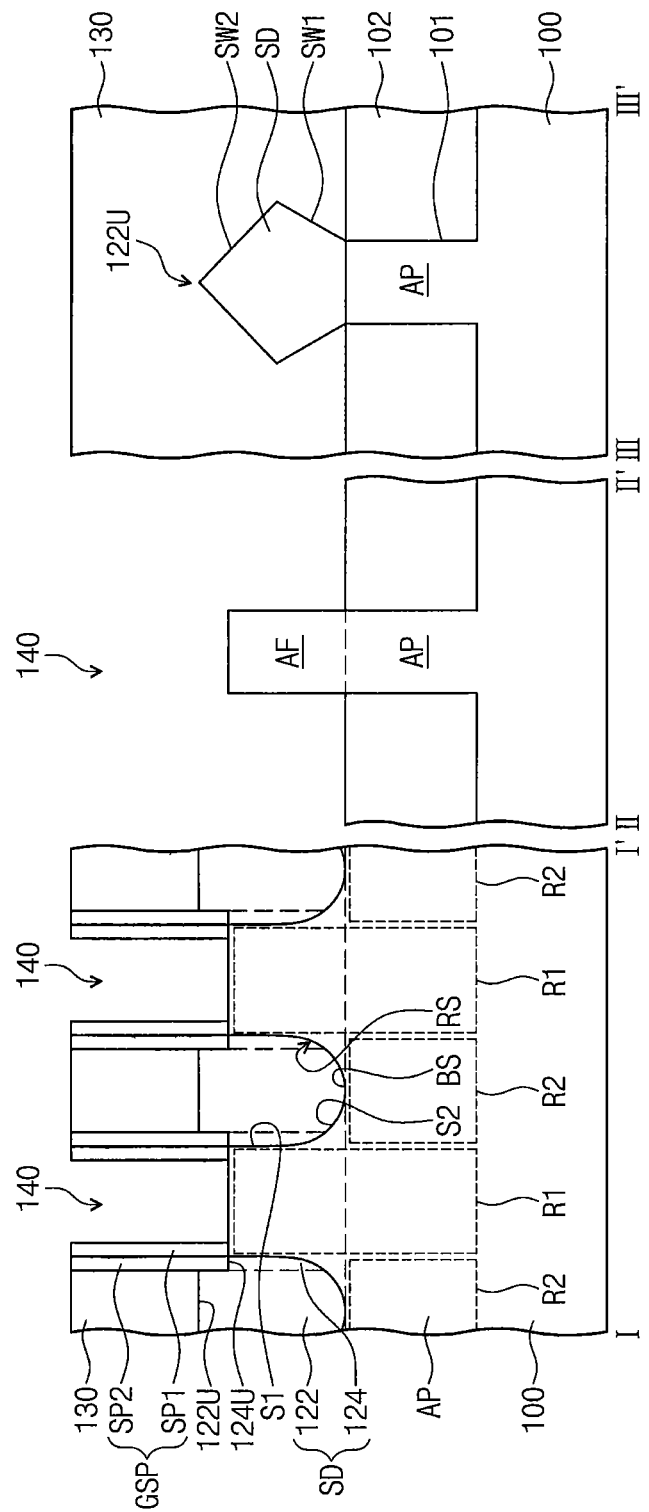

Referring to FIGS. 11A and 11B, a lower interlayer insulating layer 130 may be formed on the substrate 100 having the source/drain regions SD. The lower interlayer insulating layer 130 may be formed to cover the source/drain regions SD and the sacrificial gate structures SGS. The lower interlayer insulating layer 130 may include a silicon oxide layer, a silicon nitride layer, a silicon oxynitride, and/or low-k dielectric layers.

The gate mask patterns 109, the sacrificial gate patterns 107, and the etch stop patterns 105 may be removed to form gap regions 140 of which each is disposed between the gate spacers GSP. The gap region 140 may expose the active fin AF. During the removal of the gate mask pattern 109, a portion of the lower interlayer insulating layer 130 may also be etched. Forming the gap region 140 may include performing an etching process having an etch selectivity with respect to the gate spacers GSP, the lower interlayer insulating layer 130 and the etch stop pattern 105 to etch the sacrificial gate pattern 107. In addition, forming the gap region 140 may include removing the etch stop pattern 105 to expose the active fin AF.

Referring again to FIGS. 1A and 1B, a gate dielectric pattern GD and a gate electrode GE may be formed to fill each of the gap regions 140. In detail, a gate dielectric layer (not shown) may be formed on the substrate 100 including the gap regions 140 to partially fill the gap regions 140. The gate dielectric layer may be formed to cover the active fin AF exposed through the gap regions 140. The gate dielectric layer may include at least one of high-k dielectric layers. For example, the gate dielectric layer may include hafnium oxide, hafnium silicate, zirconium oxide, and/or zirconium silicate. The gate dielectric layer may be formed by performing an ALD process or a CVD process. A gate layer (not shown) may be formed on the gate dielectric layer to fill the gap regions 140. The gate layer may include a conductive metal nitride (e.g., titanium nitride, tantalum nitride, or tungsten nitride) and/or a metal (e.g., aluminum or tungsten). The gate layer and the gate dielectric layer may be planarized to form the gate dielectric patterns GD and the gate electrodes GE. Top surfaces of the lower interlayer insulating layer 130 and the gate spacers GSP may be exposed by the planarization process. The gate dielectric pattern GD may extend along a bottom surface of the gate electrode GE and may also extend on both sidewalls of the gate electrode GE so as to be disposed between the gate electrode GE and the gate spacers GSP.

An upper portion of the gate electrode GE may be recessed. An upper portion of the gate dielectric pattern GD may also be removed when the gate electrode GE is recessed. A gate capping pattern GP may be formed in a spaced formed by removing the upper portions of the gate electrode GE and the gate dielectric pattern GD. The gate capping pattern GP may include, for example, silicon nitride. The gate dielectric pattern GD, the gate electrode GE, and the gate capping pattern GP may be defined as a gate structure GS. The gate structure GS may extend in the second direction D2.

An upper interlayer insulating layer (not shown) may be formed on the substrate 100 including the gate structure GS. The upper interlayer insulating layer may include a silicon oxide layer, a silicon nitride layer, and/or a silicon oxynitride layer. First contact holes (not shown) may be formed to penetrate the upper interlayer insulating layer and the lower interlayer insulating layer 130. The first contact holes may expose the source/drain regions SD. Upper portions of the source/drain regions SD may be partially removed by an etching process for forming the first contact holes. A second contact hole (not shown) may be formed to penetrate the upper interlayer insulating layer and the lower interlayer insulating layer 130. The second contact hole may expose the gate electrode GE. Thereafter, first contact plugs may be formed to fill the first contact holes, respectively, and a second contact plug may be formed to fill the second contact hole. Interconnections connected to the first and second contact plugs may be formed on the upper interlayer insulating layer. Operating voltages may be applied to the source/drain regions SD and the gate electrode GE through the interconnections and the first and second contact plugs. The first and second contact plugs and the interconnections may include a conductive material.

Figure 12A:
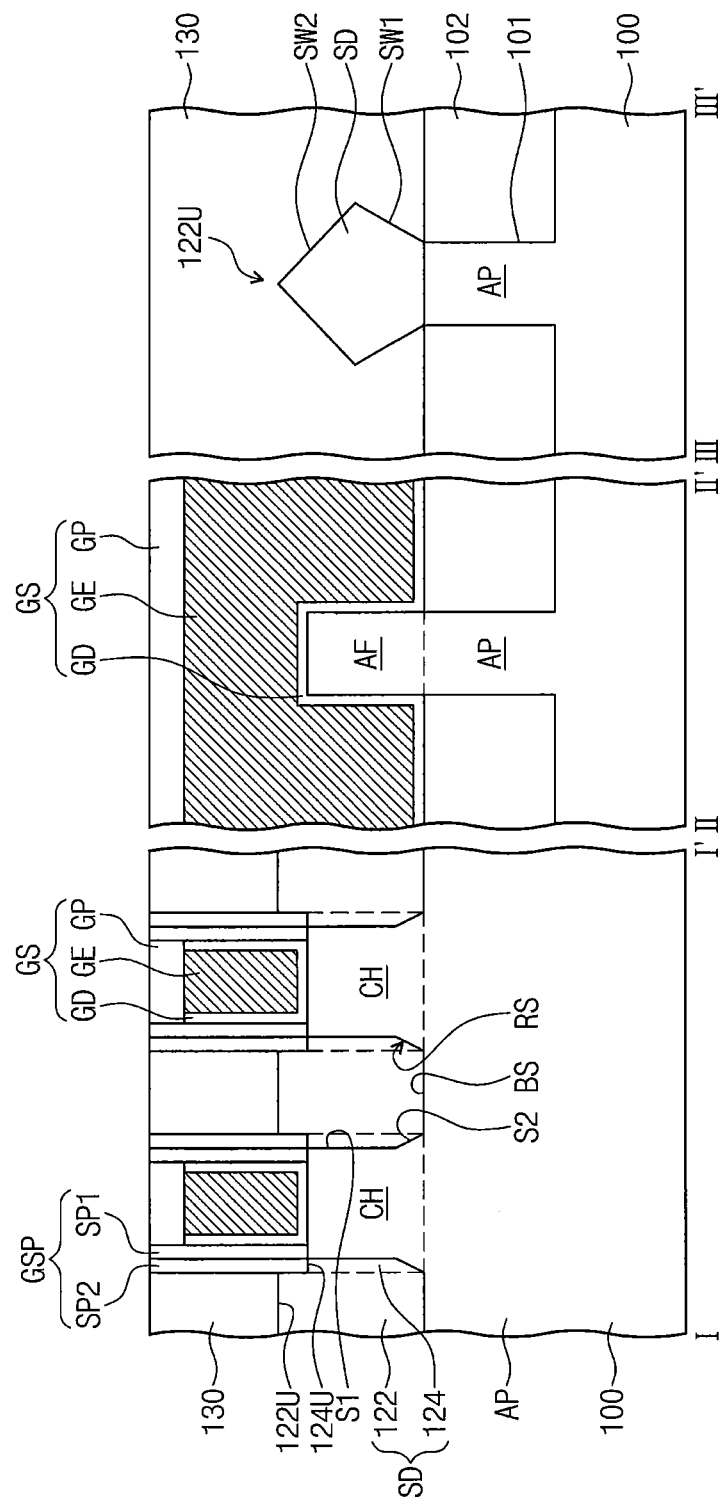
FIG. 12A is a cross-sectional view taken along the lines I-I', II-II', and III-III' of FIG. 1A to illustrate a semiconductor device according to some embodiments of the inventive concepts.
Figure 12B:
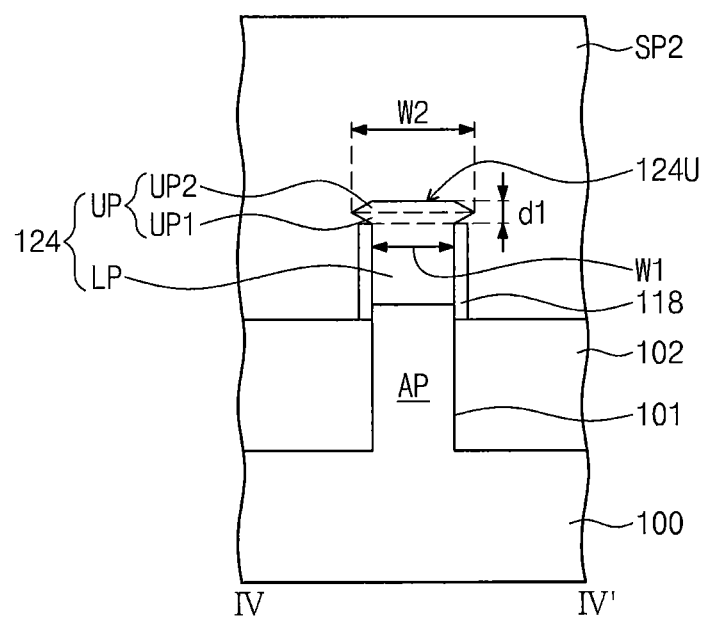
FIG. 12B is a cross-sectional view taken along the line IV-IV' of FIG. 1A.

FIG. 12A are cross-sectional views taken along the lines I-I', II-II', and III-III' of FIG. 1A to illustrate a semiconductor device according to some embodiments of the inventive concepts. FIG. 12B is a cross-sectional view taken along the line IV-IV' of FIG. 1A.

Referring to FIGS. 12A and 12B, each of recess regions RS may have a rectangular shape or a shape similar to a rectangular shape when viewed from a cross-section taken along the first direction D1. For example, each of the recess regions RS may include first sidewalls S1 substantially perpendicular to the top surface of the substrate 100, second sidewalls S2 slanted with respect to the top surface of the substrate 100, and a bottom surface BS substantially parallel to the top surface of the substrate 100. The second sidewalls S2 may be very short or may not be formed. The bottom surface BS may be disposed at the substantially same level as the top surfaces (or the topmost ends) of the device isolation patterns 102.

Source/drain regions SD may be provided on inner surfaces of the recess regions RS, respectively. Each of the source/drain regions SD may fully fill the recess region RS. Shapes of the source/drain regions SD may correspond to the shapes of the recess regions RS when viewed from a cross-section taken along the first direction D1. An interface between the active pattern AP and the source/drain region SD may have a rectangular shape or a shape similar to a rectangular shape when viewed from a cross-section taken along the first direction D1. Thus, a uniform junction profile may be realized between the active fin AF (i.e., the channel region CH) and the source/drain region SD. In some embodiments, the source/drain regions SD may protrude from the top surfaces of the channel regions CH.

Each of the source/drain regions SD may include a first portion 122 exposed by the gate spacers GSP, and second portions 124 extending from the first portion 122 and covered by the gate spacers GSP. Shapes of the first and second portions 122 and 124 may be the substantially same as or similar to corresponding shapes described with reference to FIGS. 1B and 1C, when viewed from a cross-section taken along the second direction D2. In other word, the first portion 122 may have first sidewalls SW1 and second sidewalls SW2 slanted with respect to the top surface of the substrate 100 when viewed from a cross-section taken along the second direction D2. When viewed from a cross-section taken along the second direction D2, the second portion 124 may include a lower portion LP having a first width W1, a first upper portion UP 1 extending from the lower portion LP and having a width increasing as a distance from the substrate 100 increases, and a second upper portion UP2 extending from the first upper portion UP1 and having a width decreasing as a distance from the substrate 100 increases. The first and second upper portions UP1 and UP2 may constitute an upper portion UP of the second portion 124. The upper portion UP of the second portion 124 may have a second width W2 corresponding to the maximum width at a boundary between the first and second upper portions UP1 and UP2. The second width W2 may be greater than the first width W1. The lower portion LP of the second portion 124 may be in contact with the residual spacers 118, and the upper portion UP of the second portion 124 may be exposed by the residual spacers 118. In other word, the upper portion UP of the second portion 124 may be disposed at a higher level than the top surfaces (or the topmost ends) of the residual spacers 118 and may be in contact with the second gate spacer SP2. Other elements of the semiconductor device illustrated in FIGS. 12A and 12B may be the same as or similar to corresponding elements of the semiconductor device described with reference to FIGS. 1A, 1B, and 1C.

Figure 13:
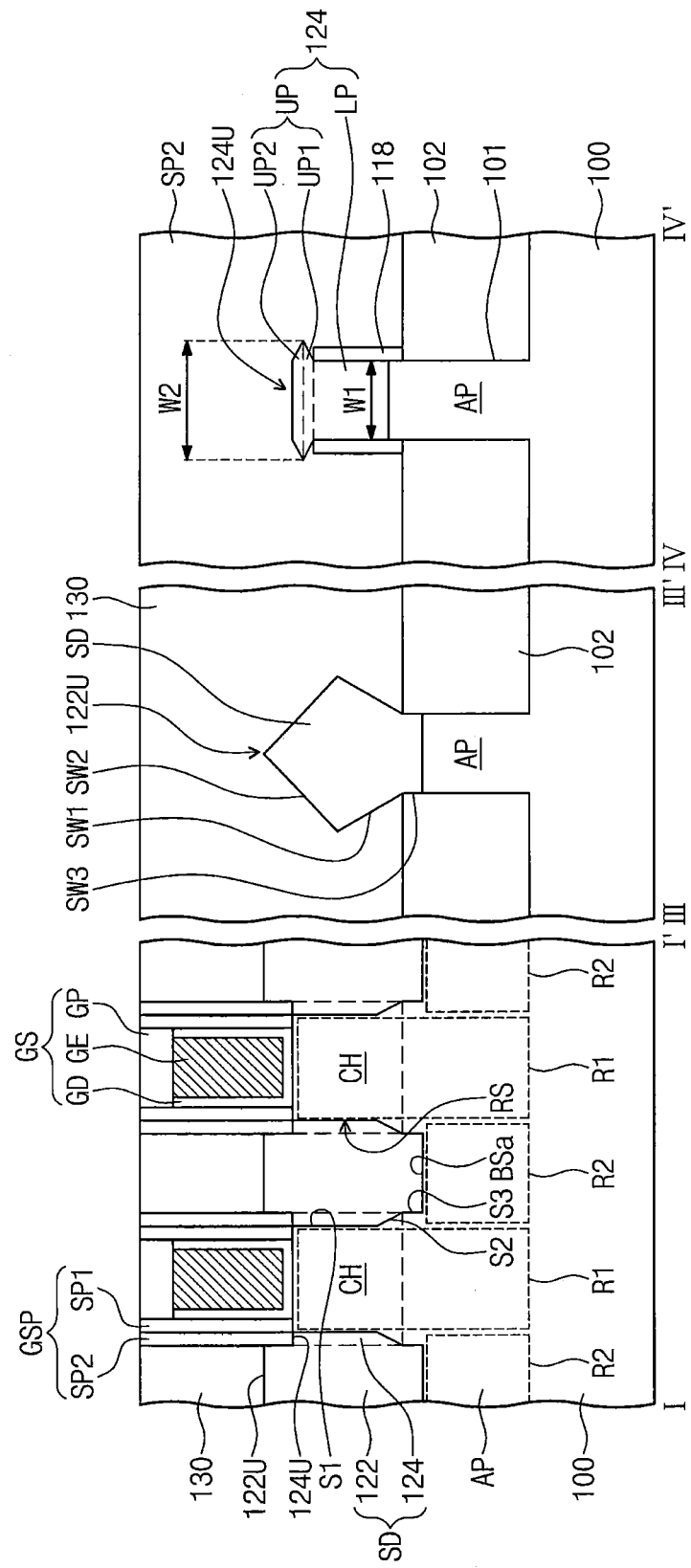
FIG. 13 is a cross-sectional view taken along the lines I-I', III-III' and IV-IV' of FIG. 1A to illustrate a semiconductor device according to some embodiments of the inventive concepts.

FIG. 13 are a cross-sectional views taken along the lines I-I', III-III', and IV-IV' of FIG. 1A to illustrate a semiconductor device according to some embodiments of the inventive concepts. For the purpose of ease and convenience in explanation, the descriptions to the same elements as in the above embodiments will be omitted or mentioned briefly.

Referring to FIG. 13, recess regions RS may extend downward to have bottom surfaces lower than the top surfaces (or the topmost ends) of the device isolation patterns 102. In more detail, each of the recess regions RS may have first sidewalls Si substantially perpendicular to the top surface of the substrate 100, second sidewalls S2 slanted with respect to the top surface of the substrate 100, third sidewalls S3 substantially perpendicular to the top surface of the substrate 100, and a bottom surface BSa substantially parallel to the top surface of the substrate 100. The second sidewalls S2 may converge toward the bottom surface BSa. Here, the bottom surface BSa may be disposed at a lower level than the top surfaces (or the topmost ends) of the device isolation patterns 102. The third sidewalls S3 may be provided between the bottom surface BSa and the second sidewalls S2 so as to be connect to the bottom surface BSa and the second sidewalls S2. In some embodiments, the second sidewalls S2 may be omitted, and the third sidewalls S3 may be connected directly to the first sidewalls S1.

Source/drain regions SD may be provided on inner sidewalls of the recess regions RS, respectively. Each of the source/drain regions SD may fully fill each of the recess regions SD. Shapes of the source/drain regions SD may correspond to the shapes of the recess regions RS when viewed from a cross-section taken along the first direction Dl. In some embodiments, the source/drain regions SD may protrude from the top surfaces of the channel regions CH. Each of the source/drain regions SD may include a first portion 122 exposed by the gate spacers GSP, and second portions 124 extending from the first portion 122 and covered by the gate spacers GSP.

The first portion 122 may have first sidewalls SW1 and second sidewalls SW2 that are slanted with respect to the top surface of the substrate 100 and third sidewalls SW3 connected to the first sidewalls SW1, when viewed from a cross-section taken along the second direction D2. The third sidewalls SW3 may be in contact with the device isolation patterns 102. A shape of the second portion 124 may be the substantially same as or similar to the shape of the second portion 124 described with reference to FIGS. 1B and 1C, when viewed from a cross-section taken along the second direction D2.

Hereinafter, a method of manufacturing a semiconductor device according to some embodiments of the inventive concepts will be described. FIGS. 14 to 21 are cross-sectional views taken along the lines I-I', II-II', and III-III' of FIG. 1A to illustrate a method of manufacturing a semiconductor device according to some embodiments of the inventive concepts.

Figure 14:
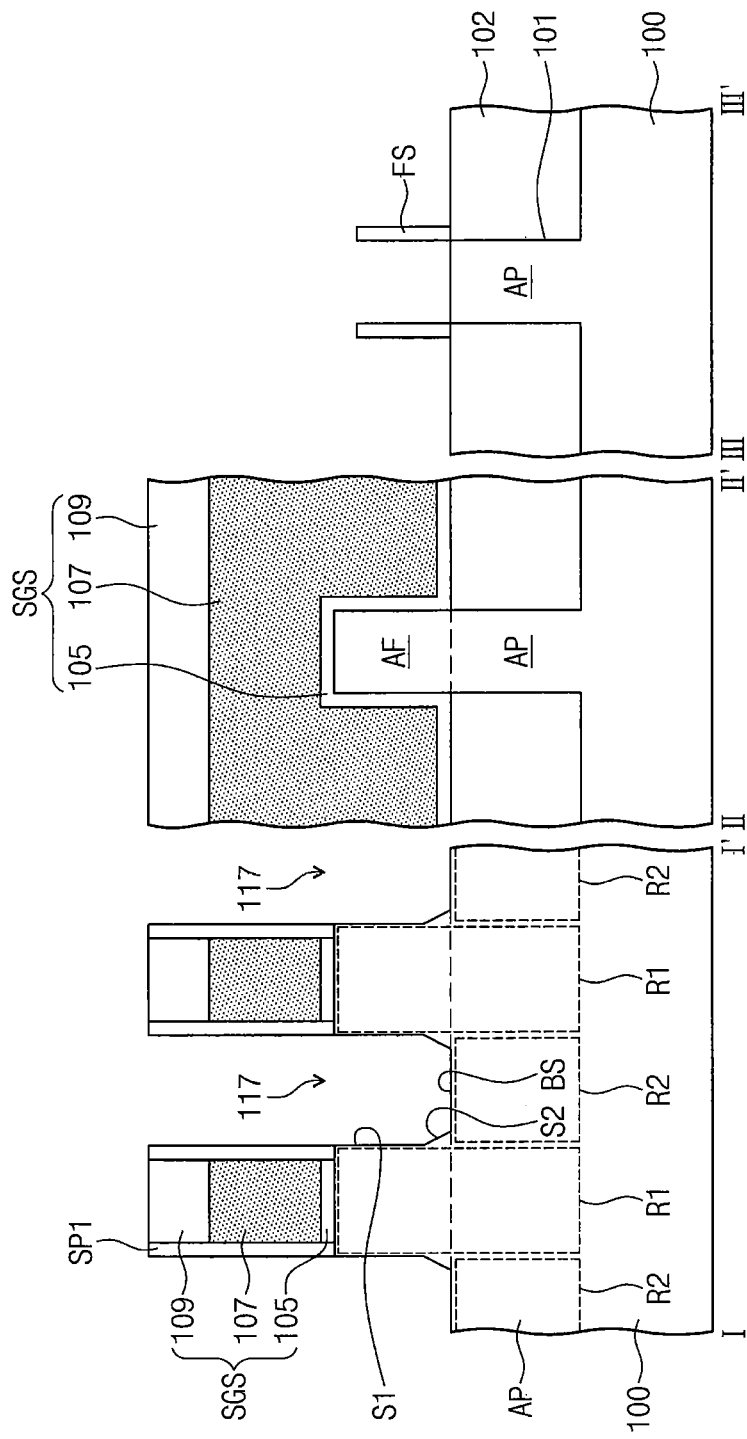
FIGS. 14 to 21 are cross-sectional views taken along the lines I-I', II-II', and III-III' of FIG. 1A to illustrate a method of manufacturing a semiconductor device according to some embodiments of the inventive concepts.

Referring to FIG. 14, second preliminary recess regions 117 may be formed in the active pattern AP. Forming the second preliminary recess regions 117 may include performing an etching process on the structure illustrated in FIGS. 5A and 5B. The etching process for forming the second preliminary recess regions 117 may include anisotropically etching the first gate spacer layer 112 to expose the top surfaces of the second regions R2, and anisotropically etching the exposed top surfaces of the second regions R2 using the sacrificial gate structures SGS and the first gate spacers SP1 as an etch mask. The anisotropic etching of the first gate spacer layer 112 and the anisotropic etching of the top surfaces of the second regions R2 may be performed by a method which is the substantially same as or similar to the method described with reference to FIGS. 6A and 6B. Recessed depths of the second preliminary recess regions 117 may be greater than those of the first preliminary recess regions 113 described with reference to FIGS. 6A and 6B.

Each of the second preliminary recess regions 117 may have first sidewalls S1 substantially perpendicular to the top surface of the substrate 100, second sidewalls S2 slanted with respect to the top surface of the substrate 100, and a bottom surface BS substantially parallel to the top surface of the substrate 100. The second sidewalls S2 may be very short or may not be formed, and thus, the second preliminary recess region 117 may have a cross-section having a rectangular shape or a shape similar to a rectangular shape. The bottom surface BS may be disposed at the substantially same level as the top surfaces (or the topmost ends) of the device isolation patterns 102. After the formation of the second preliminary recess regions 117, first gate spacers SP1 may be formed on the sidewalls of the sacrificial gate structure SGS, and portions of the first gate spacer layer 112 may remain on the sidewalls of the second region R2 to form fin spacers FS.

Figure 15:
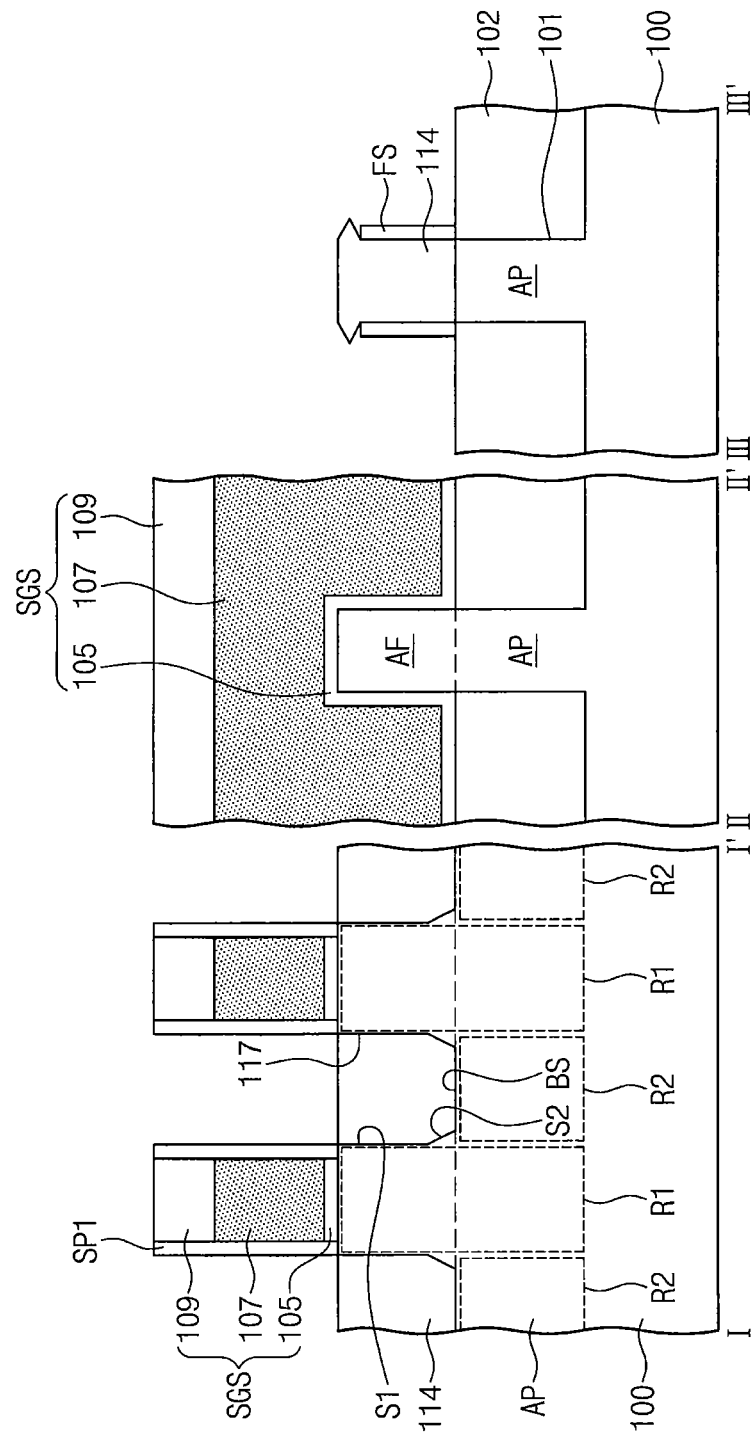

Referring to FIG. 15, a sacrificial filling pattern 114 may be formed in each of the second preliminary recess regions 117. A material and a method of forming the sacrificial filling patterns 114 may be the same as or similar to those described with reference to FIGS. 7A and 7B. The sacrificial filling pattern 114 may fully fill the second preliminary recess region 117 as illustrated in FIG. 15. Thus, a top surface of the sacrificial filling pattern 114 may be disposed at the same height as or a higher height than the top surface of the first region R1. In some embodiments, the sacrificial filling pattern 114 may not fully fill the second preliminary recess region 117. A lower portion of the sacrificial filling pattern 114 may be in contact with the fin spacers FS, and an upper portion of the sacrificial filling pattern 114 may be disposed at a higher level than the top surfaces of the fin spacers FS. A width, in the second direction D2, of the lower portion of the sacrificial filling pattern 114 may correspond to a distance between the fin spacers FS. The upper portion of the sacrificial filling pattern 114 may have wedge-shaped sidewalls that are laterally tapered. The maximum width of the upper portion of the sacrificial filling pattern 114 may be greater than the width of the lower portion of the sacrificial filling pattern 114. In some embodiments, the sacrificial filling pattern 114 may protrude upward form the top surface of the first region R1, as described with reference to FIG. 7C.

Figure 16:
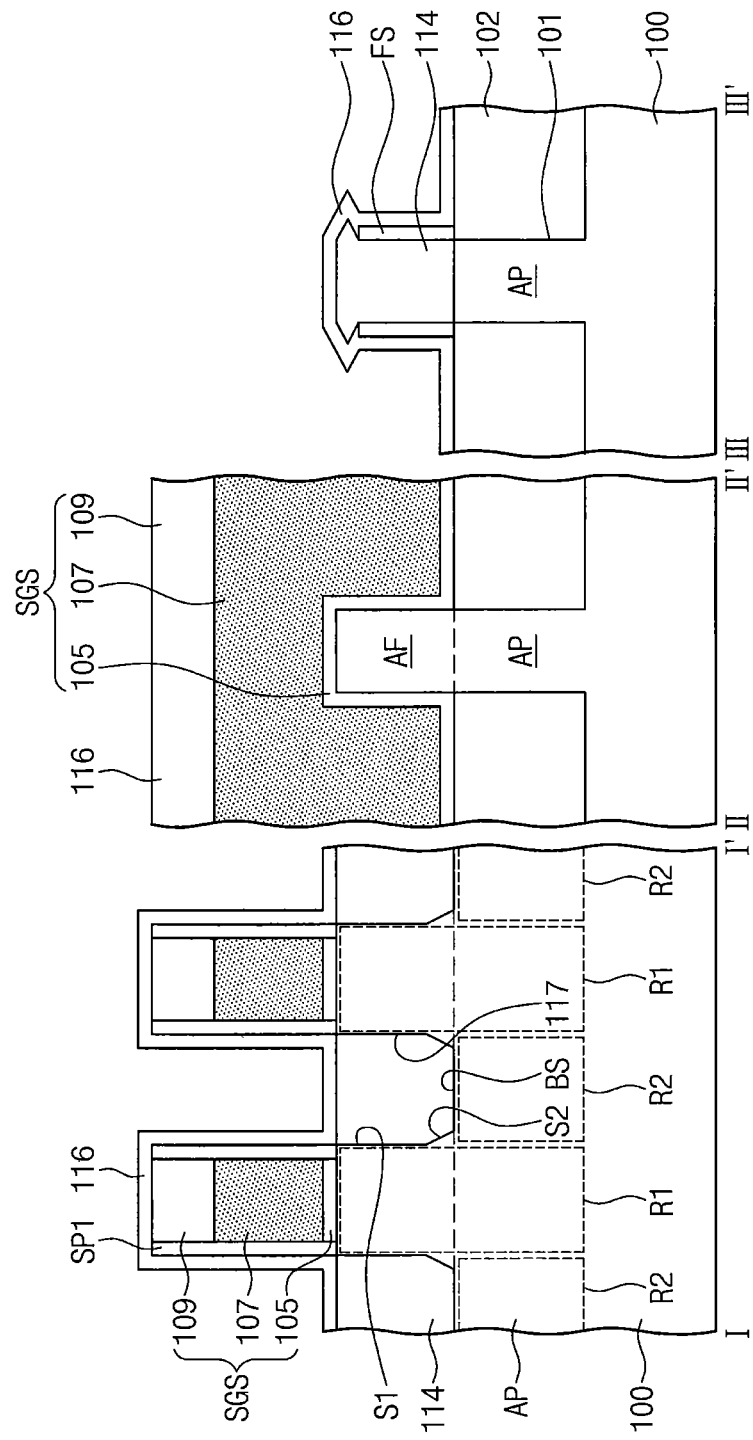

Referring to FIG. 16, a second gate spacer layer 116 may be conformally formed on the resultant structure of FIG. 15. In other word, the second gate spacer layer 116 may conformally cover the resultant structure having the sacrificial filling patterns 114. A material and a thickness of the second gate spacer layer 116 may be the same as or similar to those described with reference to FIGS. 8A and 8B.

Figure 17:
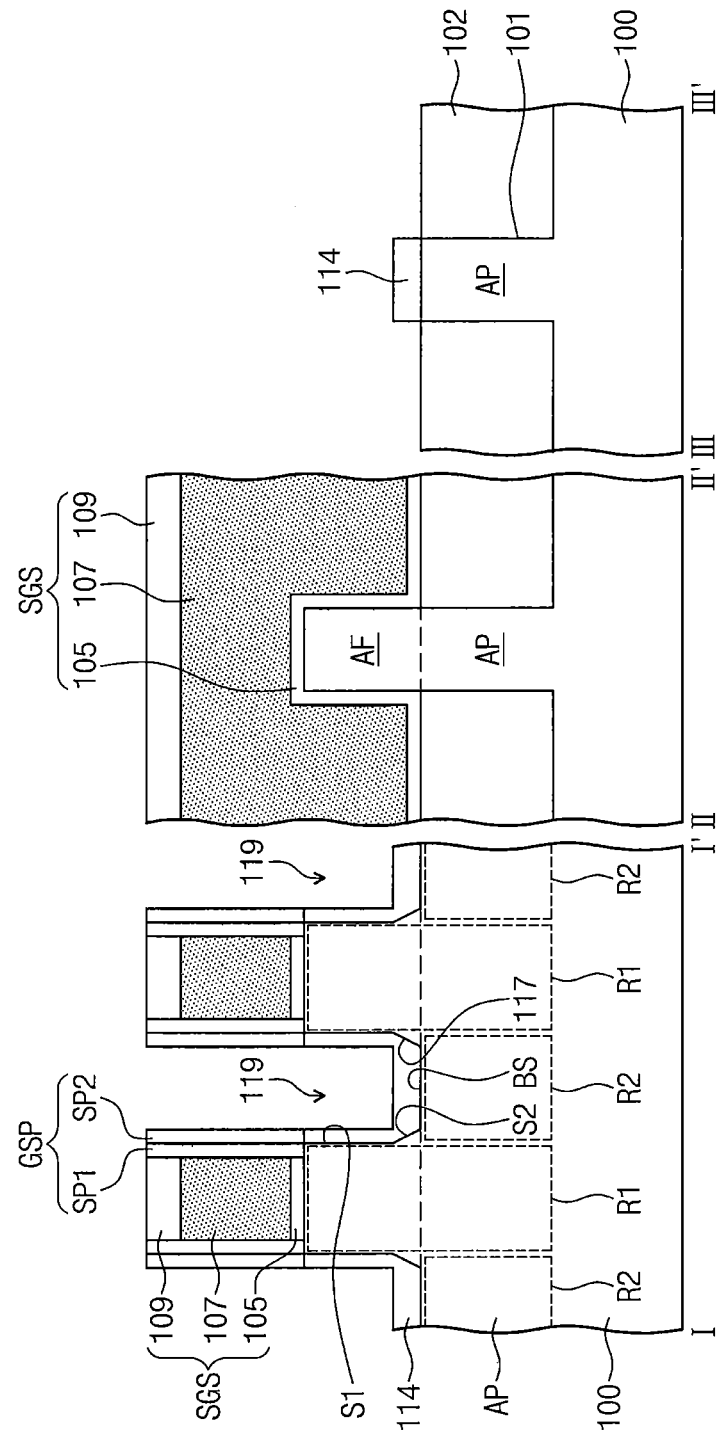

Referring to FIG. 17, the second gate spacer layer 116 may be patterned to form a second gate spacer SP2 on the sidewall of the first gate spacer SP1. The second gate spacer layer 116 may be patterned using an anisotropic etching process. The top surfaces of the sacrificial filling patterns 114 and the top surfaces of the device isolation patterns 102 may be exposed by the anisotropic etching process.

Next, portions of the sacrificial filling patterns 114 may be removed to form third preliminary recess regions 119 at both sides of the sacrificial gate structure SGS. Removing the portions of the sacrificial filling patterns 114 may be performed using an anisotropic etching process using the sacrificial gate structure SGS and the first and second gate spacers SP1 and SP2 as an etch mask. In some embodiments, the anisotropic etching process for removing the portions of the sacrificial filling patterns 114 may be performed using an etch recipe having a relatively low etch-selectivity with respect to the second gate spacer layer 116. In other word, the second gate spacer layer 116 may be etched during the etching process for removing the sacrificial filling pattern 114. Thus, the second gate spacer layer 116 and the fin spacers FS, which are disposed on the sidewalls of the second regions R2, may be removed during the formation of the third preliminary recess regions 119. In some embodiments, the second gate spacer layer 116 on the sidewalls of the second regions R2 may be completely removed, but the fin spacers FS may not be completely removed. In other word, portions of the fin spacers FS may remain under the second gate spacers SP2. After the formation of the third preliminary recess regions 119, the portions of the fin spacers FS remaining under the second gate spacers SP2 may be defined as residual spacers (e.g., 118 of FIG. 12B). The gate mask pattern 109 and the first and second gate spacers SP1 and SP2 may be partially etched during the formation of the third preliminary recess regions 119.

Figure 18:
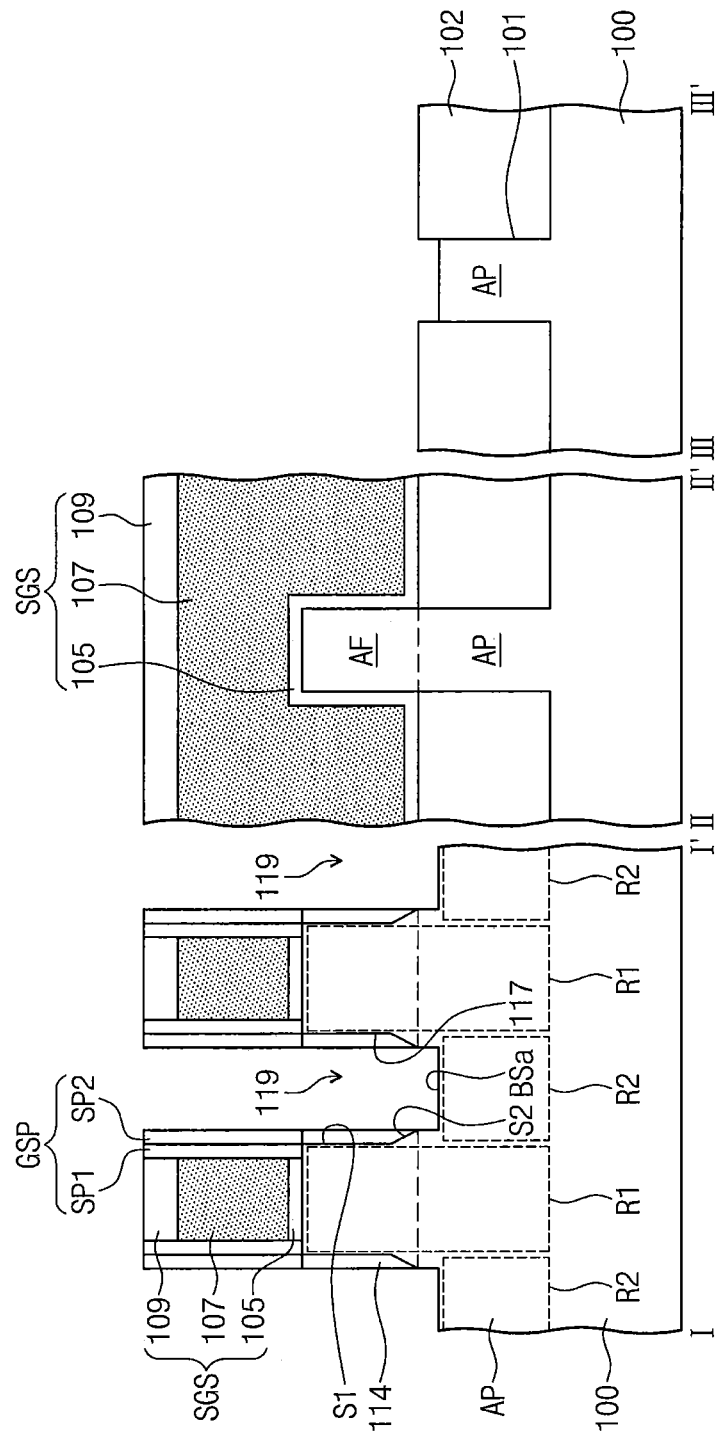

In some embodiments, the third preliminary recess regions 119 may not expose the sidewalls S1 and S2 and the bottom surface BS of the second preliminary recess regions 117 as illustrated in FIG. 17. In other word, a portion of the sacrificial filling pattern 114 may remain on the sidewalls S1 and S2 and the bottom surface BS of the second preliminary recess region 117, and the third preliminary recess regions 119 may expose the sacrificial filling pattern 114. However, the inventive concepts are not limited thereto. In some embodiments, the bottom surfaces of the second preliminary recess regions 117 may be exposed by the anisotropic etching process. In some embodiments, the third preliminary recess regions 119 may further extend downward beyond the top surfaces of the device isolation patterns 102 and may extend through the sacrificial filling pattern 114, as illustrated in FIG. 18. Bottom surfaces BSa of the third preliminary recess regions 119 may be disposed at a lower level than the top surfaces (or the topmost ends) of the device isolation patterns 102. The third preliminary recess regions 119 may have sidewalls that are aligned with the outer sidewalls of the second gate spacers SP2 and extend in a depth direction so as to be connected to the bottom surface BSa. Hereinafter, the structure of FIG. 17 will be described as an example for the purpose of ease and convenience in explanation. However, the following manufacture processes may be applied to the structure of FIG. 18.

Figure 19:
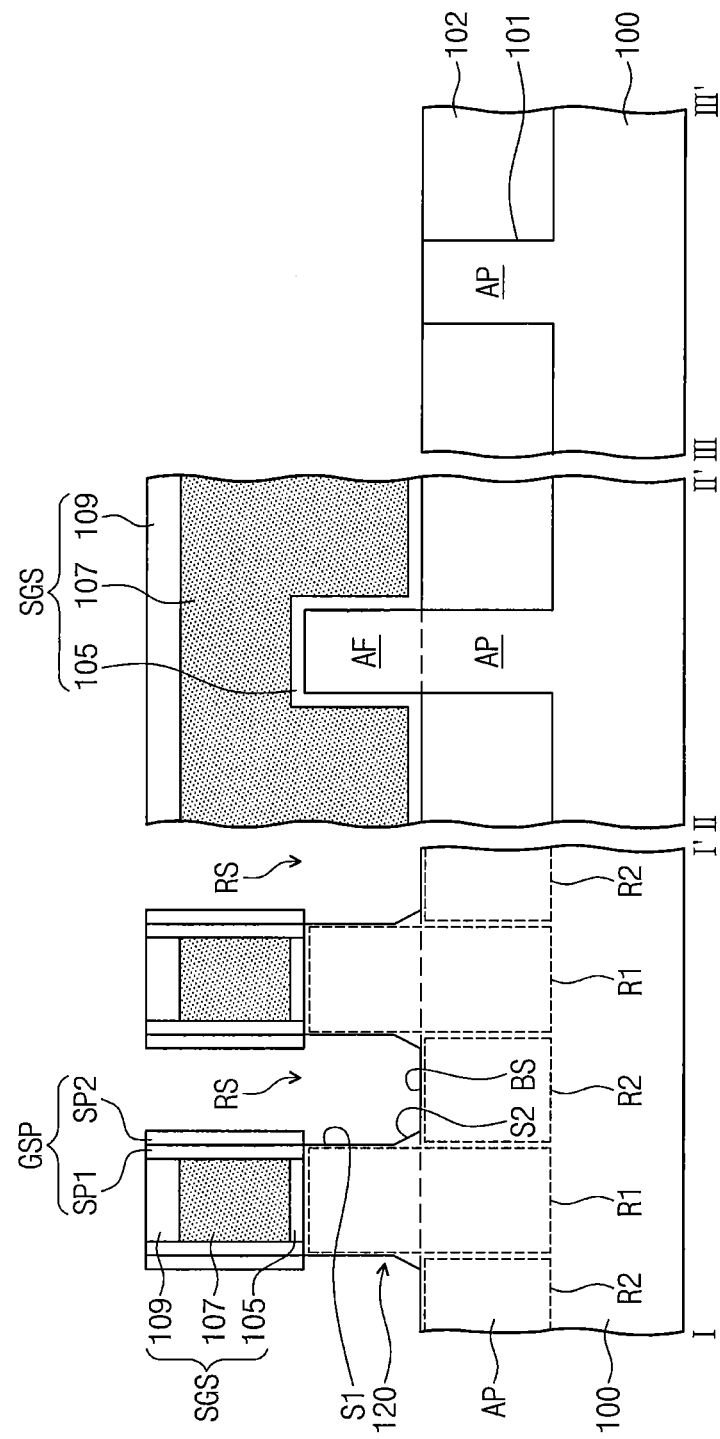

Referring to FIG. 19, the remaining portion of the sacrificial filling pattern 114 may be removed to form recess regions RS. In some embodiments, removing the remaining portion of the sacrificial filling pattern 114 may be performed using an isotropic etching process that selectively removes the sacrificial filling pattern 114. For example, if the active pattern AP includes silicon (Si) and the sacrificial filling pattern 114 includes silicon-germanium (SiGe), the isotropic etching process may be performed using an etchant including peracetic acid ($C_2H_4O_3$) and hydrofluoric acid (HF). In this case, a ratio of an etch rate of the sacrificial filling pattern 114 to an etch rate of active pattern AP may be in a range of, for example, about 10:1 to about 100:1. The etch rates may be changed according to a germanium content of the sacrificial filling pattern 114. The remaining portion of the sacrificial filling pattern 114 may be selectively and easily removed by the isotropic etching process. In other words, the sacrificial filling pattern 114 disposed under the second gate spacer SP2 may be easily removed by the isotropic etching process. A shape of the recess region RS may be the substantially same as that of the second preliminary recess region 117. In other words, each of the recess regions RS may have first sidewalls S1 substantially perpendicular to the top surface of the substrate 100, second sidewalls S2 slanted with respect to the top surface of the substrate 100, and a bottom surface BS substantially parallel to the top surface of the substrate 100. The second sidewalls S2 may be very short or may not be formed. Thus, the recess region RS may have a cross section having a rectangular shape or a shape similar to a rectangular shape. The bottom surfaces BS of the recess regions RS may be disposed at the substantially same level as the top surfaces (or the topmost ends) of the device isolation patterns 102. The recess regions RS may include undercut regions 120 disposed under the second gate spacers SP2. A shape of the undercut region 120 may be the substantially same as the shape of the second portion 124 of the source/drain region SD described with reference to FIG. 12B.

Figure 20:
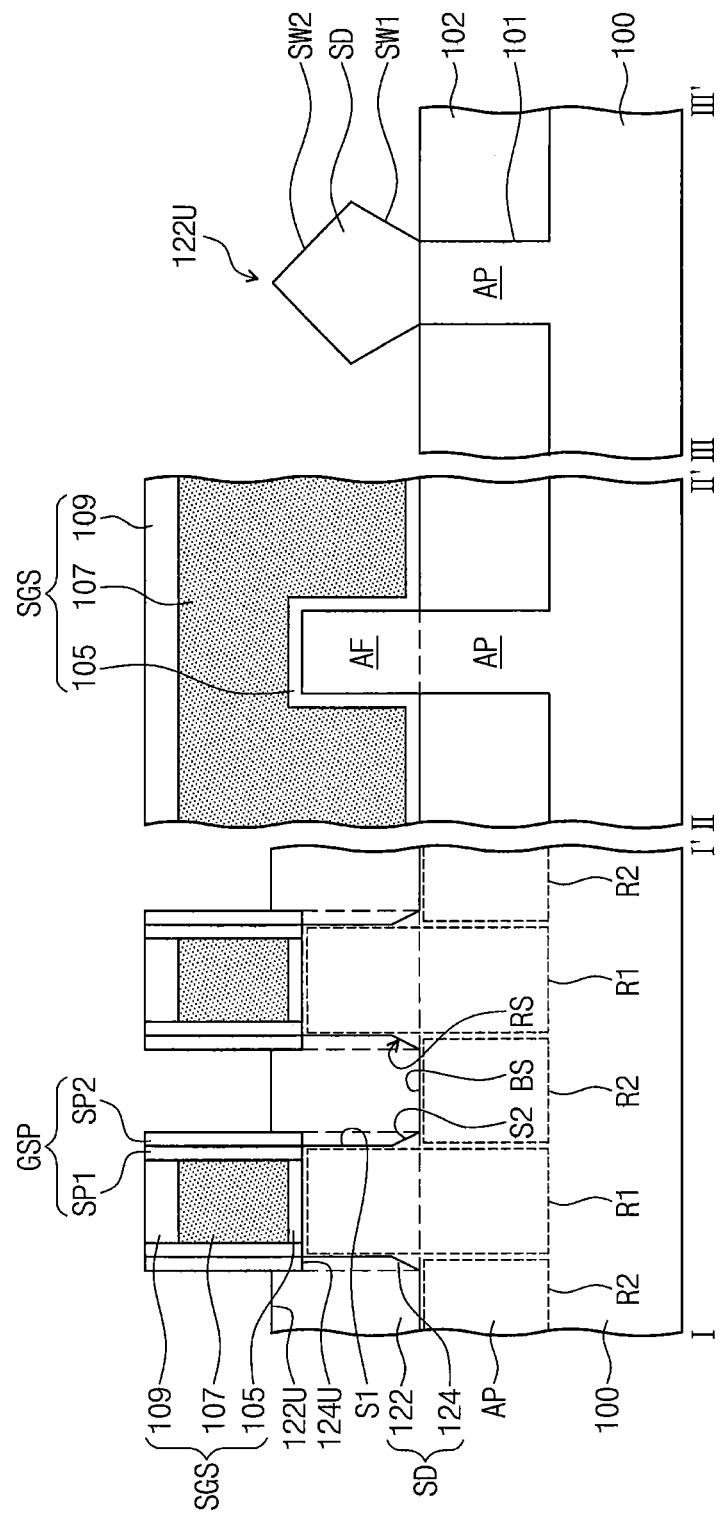

Referring to FIG. 20, source/drain regions SD may be formed on inner surfaces of the recess regions RS, respectively. A material and a method of forming the source/drain regions SD may be the same as or similar to those described with reference to FIGS. 10A and 10B. The source/drain regions may be formed by performing a SEG process using the active pattern AP exposed through the recess regions RS as a seed. Each of the source/drain regions SD may fully fill each of the recess regions RS. In addition, the source/drain regions SD may protrude from the top surfaces of the active fins AF. The shapes of the source/drain regions SD may be similar to those described with reference to FIGS. 12A and 12B.

Figure 21:
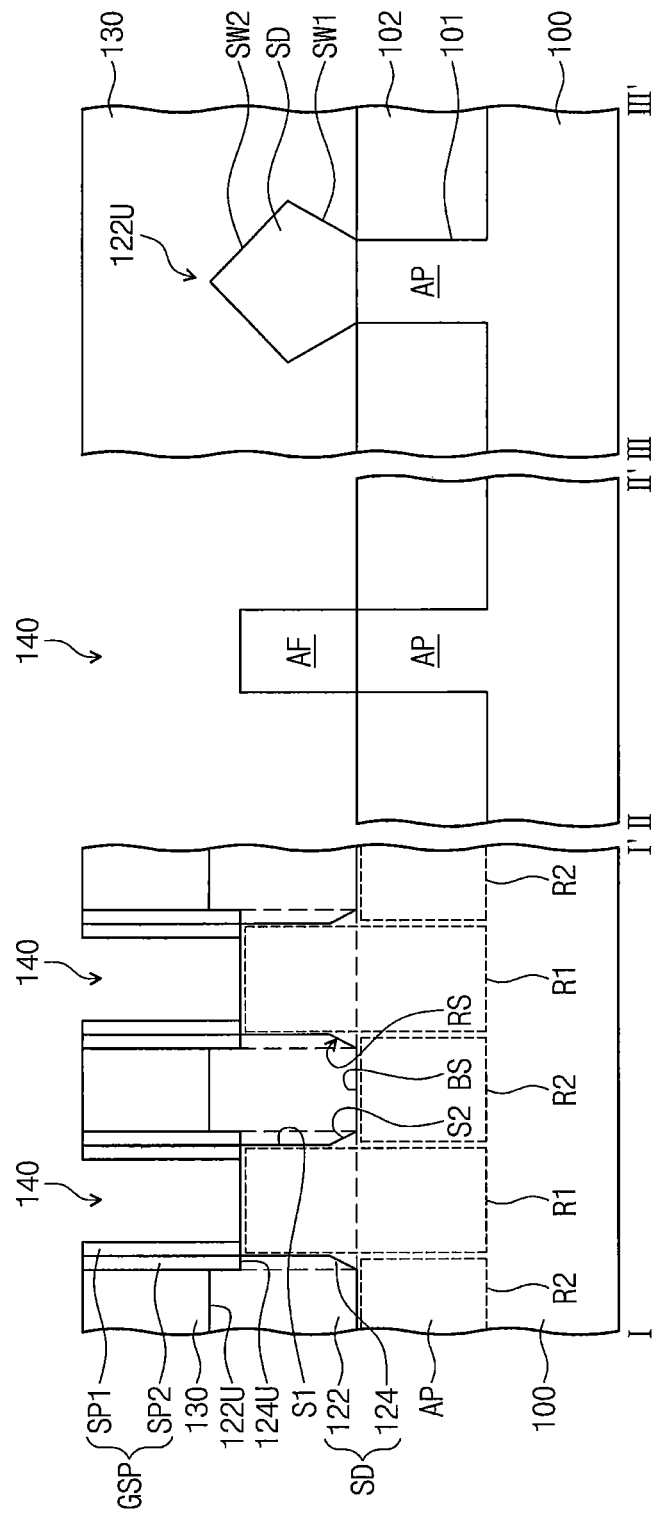

Referring to FIG. 21, a lower interlayer insulating layer 130 may be formed on the substrate 100 having the source/drain regions SD. Next, the gate mask pattern 109, the sacrificial gate pattern 107 and the etch stop pattern 105 may be removed to form a gap region 140 between the gate spacers GSP. A method of forming the lower interlayer insulating layer 130 and the gap region 140 may be the same as or similar to the method described with reference to FIGS. 11A and 11B.

Referring again to FIGS. 12A and 12B, a gate dielectric pattern GD and a gate electrode GE may be formed to fill the gap region 140. The gate dielectric pattern GD may extend along a bottom surface of the gate electrode GE and may also extend onto both sidewalls of the gate electrode GE so as to be disposed between the gate electrode GE and the gate spacers GSP. Next, an upper portion of the gate electrode GE may be recessed, and a gate capping pattern GP may be disposed on the recessed gate electrode GE. Materials and methods of forming the gate dielectric pattern GD, the gate electrode GE and the gate capping pattern GP may be the same as or similar to those described with reference to FIGS. 1A and 1B.

Figure 22:
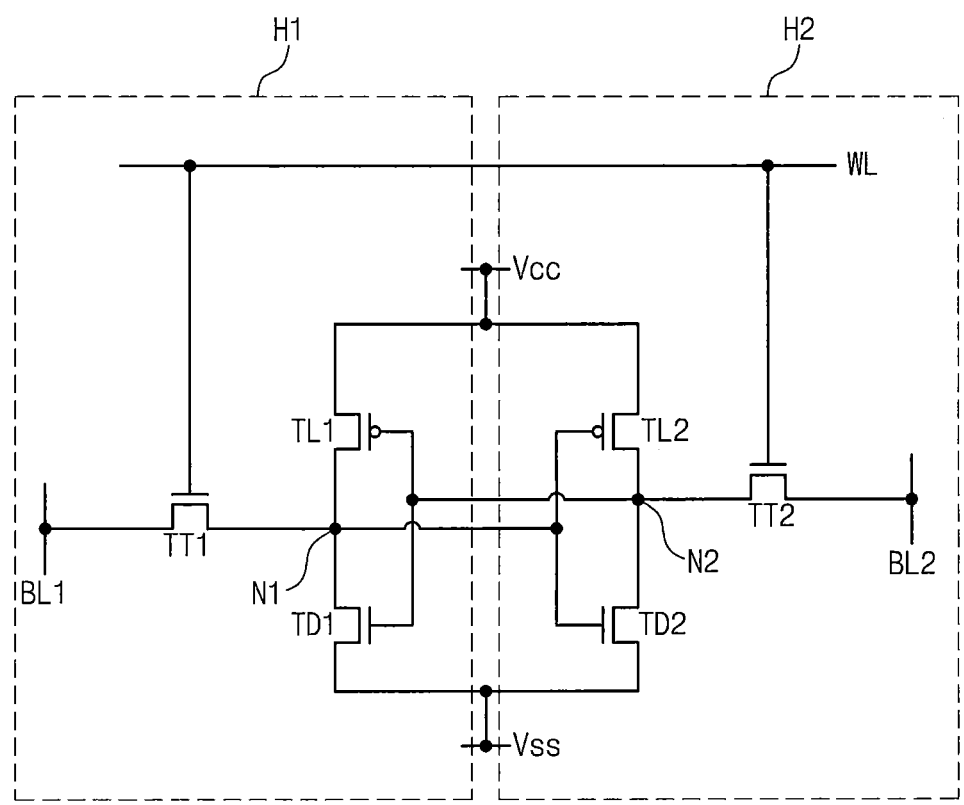
FIG. 22 is a circuit diagram of a complementary metal-oxide-semiconductor static random access memory cell (CMOS SRAM cell) including a field effect transistor according to example embodiments of the inventive concepts.

FIG. 22 is a circuit diagram of a complementary metal-oxide-semiconductor static random access memory cell (CMOS SRAM cell) including a field effect transistor according to example embodiments of the inventive concepts. Referring to FIG. 22, a CMOS SRAM cell may include a pair of driver transistors TD1 and TD2, a pair of transfer transistors TT1 and TT2, and a pair of load transistors TL1 and TL2. The driver transistors TD1 and TD2 may correspond to pull-down transistors, the transfer transistors TT1 and TT2 may correspond to pass transistors, and the load transistors TL1 and TL2 may correspond to pull-up transistors. The driver transistors TD1 and TD2 and the transfer transistors TT1 and TT2 may be NMOS transistors, and the load transistors TL1 and TL2 may be PMOS transistors. At least one of the driver transistors TD1 and TD2, the transfer transistors TT1 and TT2 and the driver transistors TL1 and TL2 may be a semiconductor device according to some embodiments of the inventive concepts.

The first driver transistor TD1 and the first transfer transistor TT1 may be in series to each other. A source region of the first driver transistor TD1 may be electrically connected to a ground line Vss, and a drain region of the first transfer transistor TT1 may be electrically connected to a first bit line BL1. The second driver transistor TD2 and the second transfer transistor TT2 may be in series to each other. A source region of the second driver transistor TD2 may be electrically connected to the ground line Vss, and a drain region of the second transfer transistor TT2 may be electrically connected to a second bit line BL2.

A source region and a drain region of the first load transistor TL1 may be electrically connected to a power line Vcc and a drain region of the first driver transistor TD1, respectively. A source region and a drain region of the second load transistor TL2 may be electrically connected to the power line Vcc and a drain region of the second driver transistor TD2, respectively. The drain region of the first load transistor TL1, the drain region of the first driver transistor TD1, and a source region of the first transfer transistor TT1 may correspond to a first node N1. The drain region of the second load transistor TL2, the drain region of the second driver transistor TD2, and a source region of the second transfer transistor TT2 may correspond to a second node N2. A gate electrode of the first driver transistor TD1 and a gate electrode of the first load transistor TL1 may be electrically connected to the second node N2. A gate electrode of the second driver transistor TD2 and a gate electrode of the second load transistor TL2 may be electrically connected to the first node N1. Gate electrodes of the first and second transfer transistors TT1 and TT2 may be electrically connected to a word line WL. The first driver transistor TD1, the first transfer transistor TT1, and the first load transistor TL1 may constitute a first half-cell H1. The second driver transistor TD2, the second transfer transistor TT2, and the second load transistor TL2 may constitute a second half-cell H2.

Figure 23:
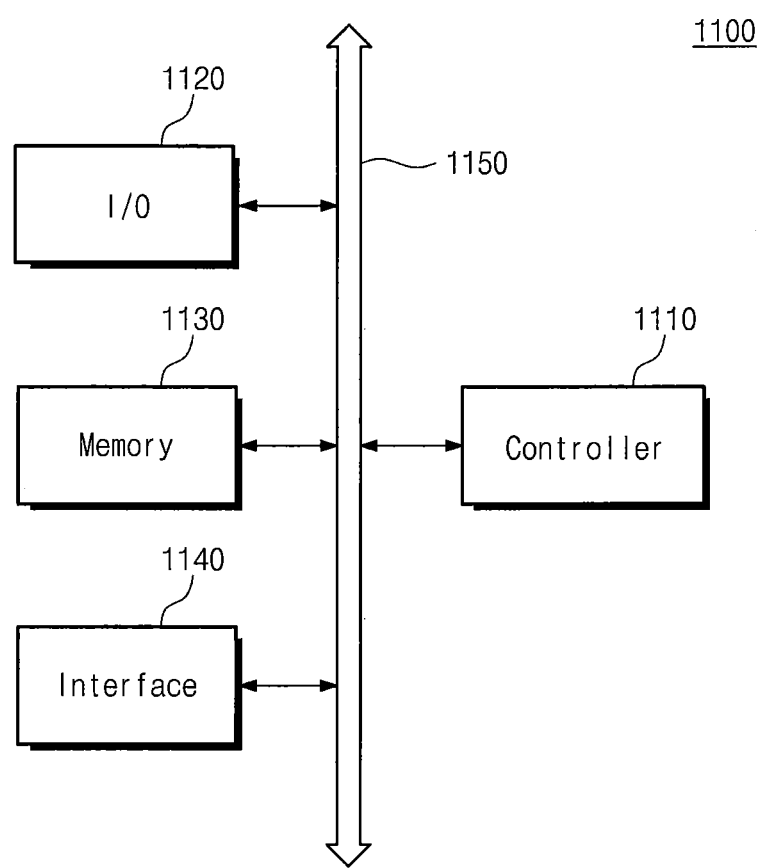
FIG. 23 is a block diagram illustrating an electronic system including a semiconductor device according to some embodiments of the inventive concepts.

FIG. 23 is a block diagram illustrating an electronic system including a semiconductor device according to some embodiments of the inventive concepts.

Referring to FIG. 23, an electronic system 1100 according to some embodiments of the inventive concepts may include a controller 1110, an input/output (I/O) unit 1120, a memory device 1130, an interface unit 1140, and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or other logic devices having a similar function to any one thereof. The I/O unit 1120 may include a keypad, a keyboard and/or a display device. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna or a wireless/cable transceiver. Although not shown in the drawings, the electronic system 1100 may further include a fast dynamic random access memory (DRAM) device and/or a fast SRAM device as a cache memory for improving an operation of the controller 1110. Semiconductor devices according to some embodiments of the inventive concepts may be provided in the memory device 1130, the controller 1110 and/or the I/O 1120.

The electronic system 1100 may be applied to a personal digital assistant (PDA), a portable computer, a web tablet, a wireless phone, a mobile phone, a digital music player, a memory card, or other electronic products receiving or transmitting information data by wireless.

Figure 24:
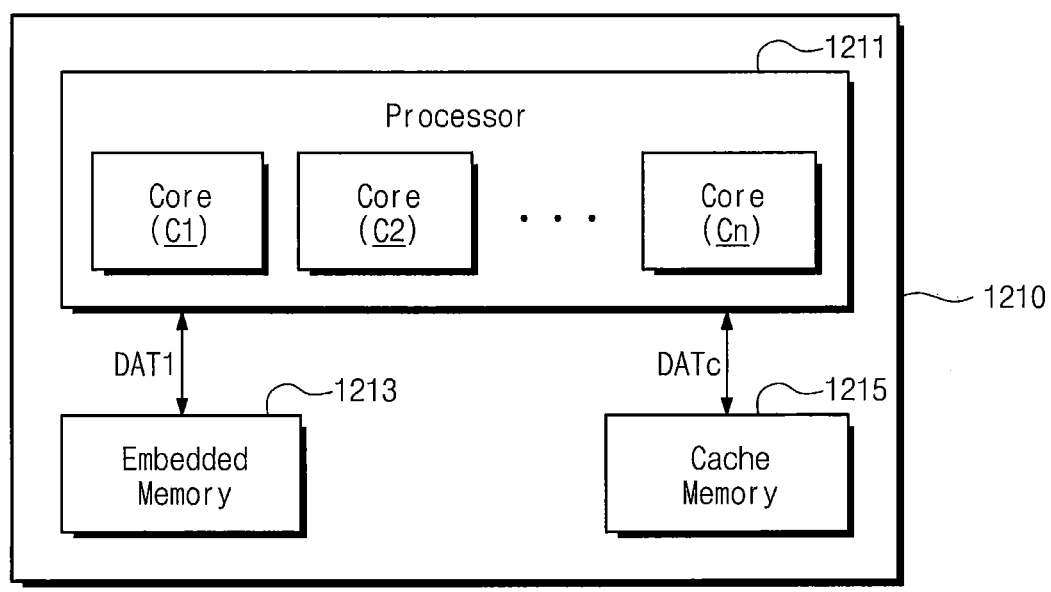
FIG. 24 is a block diagram illustrating an electronic device including a semiconductor device according to some embodiments of the inventive concepts.

FIG. 24 is a block diagram illustrating an electronic device including a semiconductor device according to some embodiments of the inventive concepts.

Referring to FIG. 24, an electronic device 1200 may include a semiconductor chip 1210. The semiconductor chip 1210 may include a processor 1211, an embedded memory 1213, and a cache memory 1215.

The processor 1211 may include one or more processor cores C1 to Cn. The one or more process cores C1 to Cn may process electrical data and/or electrical signals. The process cores C1 to Cn may include semiconductor devices according to some embodiments of the inventive concepts.

The electronic device 1200 may perform a specific function corresponding to the processed data and signals. For example, the processor 1211 may be an application processor.

The embedded memory 1213 may exchange first data DAT1 with the processor 1211. The first data DAT1 may be data processed or to be processed by the one or more processor cores C1 to Cn. The embedded memory 1213 may manage the first data DAT1. For example, the embedded memory 1213 may buffer the first data DAT1. In other words, the embedded memory 1213 may act as a buffer memory or working memory of the processor 1211.

In some embodiments, the electronic device 1200 may be applied to a wearable electronic device. The wearable electronic device may mainly perform a function requiring a relatively small quantity of operations. Thus, if the electronic device 1200 is applied to the wearable electronic device, the embedded memory 1213 may not need a great buffer capacity.

The embedded memory 1213 may be a SRAM. An operating speed of the SRAM may be faster than that of a DRAM. When the SRAM is embedded in the semiconductor chip 1210, it is possible to realize the electronic device 1200 having a small size and a fast operating speed. In addition, when the SRAM is embedded in the semiconductor chip 1210, consumption of an active power of the electronic device 1200 may be reduced. The SRAM may include a semiconductor device according to some embodiments of the inventive concepts.

The cache memory 1215 may be mounted on the semiconductor chip 1210 along with the one or more process cores C1 to Cn. The cache memory 1215 may store cache data DATc. The cache data DATc may be data used by the one or more process cores C1 to Cn. The cache memory 1215 may have a relatively small capacity but may have a very fast operating speed. In some embodiments, the cache memory 1215 may include a SRAM including a semiconductor device according to some embodiments of the inventive concepts. When the cache memory 1215 is used, it is possible to reduce an accessing number and an accessing time of the processor 1211 with respect to the embedded memory 1213. Thus, the operating speed of the electronic device 1200 may be improved when the cache memory 1215 is used.

In FIG. 24, the cache memory 1215 is separated from the processor 1211 for the purpose of ease and convenience in explanation. However, in some embodiments, the cache memory 1215 may be included in the processor 1211. In other words, the inventive concepts are not limited to the embodiment illustrated in FIG. 24.

The processor 1211, the embedded memory 1213, and the cache memory 1215 may transmit electrical data on the basis of at least one of various interface protocols. For example, the processor 1211, the embedded memory 1213, and the cache memory 1215 may transmit electrical data on the basis of at least one interface protocol of universal serial bus (USB), small computer system interface (SCSI), peripheral component interconnect (PCI) express, advanced technology attachment (ATA), parallel ATA (PATA), serial ATA (SATA), serial attached SCSI (SAS), integrated drive electronics (IDE), or universal flash storage (UFS).

Figure 25:
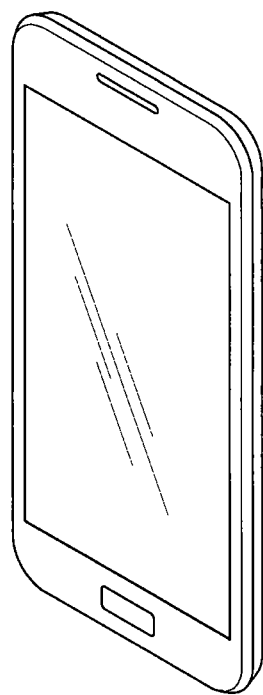
FIG. 25 illustrates a mobile phone implemented with an electronic system according to embodiments of the inventive concepts.

The electronic system 1100 of FIG. 23 may be applied to electronic control devices of various electronic products. FIG. 25 illustrates a mobile phone 2000 implemented with the electronic system 1100 of FIG. 23. The electronic system 1100 of FIG. 23 may also be applied to a portable notebook, a MP3 player, a navigation device, a solid state disk (SSD), cars, or household appliances.

According to some embodiments of the inventive concepts, the recess regions may be formed in the active pattern at both sides of the sacrificial gate pattern including the gate spacer, and then the source/drain regions may be formed to fill the recess regions. A portion of the active pattern under the gate spacer may be replaced with the sacrificial filling pattern of which the etch rate is higher than that of the active pattern, and thus, the sacrificial filling pattern disposed under the gate spacer may be easily removed during the etching process for forming the recess regions. As a result, the recess region may be formed to have the U-shaped cross-sectional profile of which the both end portions are substantially perpendicular to the top surface of the substrate. This means that the uniform junction profile may be realized between the active pattern (i.e., the active fin) disposed under the gate electrode and the source/drain region filling the recess region. Thus, the electrical characteristics of the semiconductor device may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of forming an integrated circuit device comprising:
    forming a gate structure on a substrate;
    forming a first etch mask on a sidewall of the gate structure;
    anisotropically etching the substrate using the gate structure and the first etch mask as an etch mask to form a preliminary recess in the substrate, the preliminary recess having a first depth;
    forming a sacrificial layer in the preliminary recess;
    forming a second etch mask on the first etch mask, the first etch mask extending between the sidewall of the gate structure and the second etch mask;
    etching the sacrificial layer and the substrate beneath the sacrificial layer using the gate structure and the first and second etch masks as an etch mask to form a source/drain recess in the substrate, a sidewall of the source/drain recess being recessed toward the gate structure relative to an outer surface of the second etch mask, and the source/drain recess having a second depth that is greater than the first depth; and
    forming a source/drain in the source/drain recess.

2. The method of claim 1, wherein etching the sacrificial layer and the substrate comprises exposing a sidewall of the preliminary recess that is defined by the substrate, and the sidewall of the preliminary recess comprises the sidewall of the source/drain recess.

3. The method of claim 2, wherein forming the first etch mask comprises forming the first etch mask having a thickness of about 1nm to about 10nm on the sidewall of the gate structure such that the sidewall of the preliminary recess is spaced apart from the sidewall of the gate structure by about 1nm to about 10nm.

4. The method claim 1, wherein the preliminary recess comprises a first preliminary recess, and
    wherein etching the sacrificial layer and the substrate comprises:
        etching the sacrificial layer and the substrate using the gate structure and the first and second etch masks as an etch mask to form a second preliminary recess in the sacrificial layer and the substrate; and then
        removing the sacrificial layer to form the source/drain recess in the substrate.

5. The method of claim 4, wherein the second preliminary recess extends through the sacrificial layer.

6. The method of claim 1, wherein etching the sacrificial layer and the substrate comprises performing an anisotropic etch process and an isotropic etch process.

7. A method of forming an integrated circuit device comprising:
    forming a gate structure on a substrate;
    forming a sacrificial layer adjacent a sidewall of the gate structure in the substrate, an upper portion of a sidewall of the sacrificial layer being substantially perpendicular to a lowermost surface of the gate structure;

forming an etch mask on the sidewall of the gate structure and a portion of the sacrificial layer;

etching the sacrificial layer and the substrate beneath the sacrificial layer using the gate structure and the etch mask as an etch mask to form a source/drain recess in the substrate; and forming a source/drain in the source/drain recess, wherein an upper portion of a sidewall of the source/drain recess is recessed toward the gate structure relative to an outer surface of the etch mask.

8. The method claim 7, wherein the upper portion of the sidewall of the source/drain recess is substantially perpendicular to the lowermost surface of the gate structure.

9. The method claim 7, wherein etching the sacrificial layer and the substrate comprises:

etching the sacrificial layer and the substrate using the gate structure and the etch mask as an etch mask to form a preliminary recess that extends through the sacrificial layer; and then removing the sacrificial layer to form the source/drain recess in the substrate.

10. The method claim 9, wherein removing the sacrificial layer comprises exposing a sidewall of the preliminary recess that is defined by the substrate such that the sidewall of the preliminary recess comprises the sidewall of the source/drain recess.

11. The method of claim 7, wherein forming the sacrificial layer comprises:

etching the substrate to form a recess adjacent the sidewall of the gate structure in the substrate, a sidewall of the recess being substantially perpendicular to the lowermost surface of the gate structure; and performing an epitaxial growth process using a surface of the recess as a seed layer to form the sacrificial layer in the recess.

12. A method of forming an integrated circuit device comprising:

forming a gate structure on a substrate;

forming a first recess adjacent a sidewall of the gate structure in the substrate, a sidewall of the first recess being substantially perpendicular to a lowermost surface of the gate structure and being spaced apart from the sidewall of the gate structure by a first distance;

forming a sacrificial layer in the first recess;

forming a second recess that extends through the sacrificial layer and is in a portion of the substrate beneath the sacrificial layer, an uppermost sidewall of the second recess being spaced apart from the sidewall of the gate structure by a second distance that is greater than the first distance;

removing the sacrificial layer to form a source/drain recess in the substrate; and forming a source/drain in the source/drain recess.

13. The method of claim 12, wherein the second recess has a depth greater than a depth of the first recess.

14. The method of claim 12, wherein removing the sacrificial layer comprises exposing the sidewall of the first recess such that the sidewall of the first recess comprises a sidewall of the source/drain recess.

15. The method of claim 14, wherein the first distance is about 1nm to about 10nm.

16. The method of claim 12, wherein the uppermost sidewall of the second recess exposes the sacrificial layer.

17. The method of claim 12, wherein an uppermost sidewall of the source/drain is spaced apart from the sidewall of the gate structure by a third distance that is smaller than the second distance.

18. The method of claim 12, wherein removing the sacrificial layer to form. the source/drain recess is performed after forming the second recess.

19. The method of claim 1, wherein an upper portion of a sidewall of the source/drain is aligned with a lower portion of an outer surface of the first etch mask.

20. The method of claim 19, wherein the upper portion of the sidewall of the source/drain is substantially perpendicular to a lowermost surface of the gate structure.

* * * * *